(12) United States Patent
Iwahashi et al.

(10) Patent No.: US 6,856,574 B2
(45) Date of Patent: Feb. 15, 2005

(54) SEMICONDUCTOR MEMORY DEVICE

(75) Inventors: Satoshi Iwahashi, Ome (JP); Keiichi Higeta, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/720,118

(22) Filed: Nov. 25, 2003

(65) Prior Publication Data

US 2004/0105339 A1 Jun. 3, 2004

(30) Foreign Application Priority Data

Nov. 28, 2002 (JP) ........................................ 2002-345464

(51) Int. Cl.[7] ................................................. G11C 8/00
(52) U.S. Cl. ........................ 365/233; 365/194; 365/365; 365/230.06
(58) Field of Search ................................. 365/233, 194, 365/230.06

(56) References Cited

U.S. PATENT DOCUMENTS 4,890,262 A * 12/1989 Hashimoto et al. ......... 365/236
6,128,748 A * 10/2000 MacWilliams et al. ..... 713/401
6,324,118 B1 * 11/2001 Ooishi ........................ 365/233

FOREIGN PATENT DOCUMENTS

| JP | 10-188555 | 7/1998 |
| JP | 11-306758 | 11/1999 |

* cited by examiner

Primary Examiner—Huan Hoang
(74) Attorney, Agent, or Firm—Mattingly, Stanger & Malur, P.C.

(57) ABSTRACT

A semiconductor memory device comprises a memory-cell array for storing data, a peripheral circuit for carrying out an operation to read out or write data from or into the memory-cell array, read clock generation circuits (111, 113 and 115) each used for generating a read clock signal to be supplied to the peripheral circuit in the operation to read out data from the memory-cell array, write clock generation circuits (112, 114 and 116) each used for generating a write clock signal to be supplied to the peripheral circuit in the operation to write data into the memory-cell array. Since the pulse widths of the clock signals in read and writes are adjusted individually, margin insufficiencies of the pulse widths can be evaluated and results of the evaluation can be fed back to a design phase for, among other purposes, correction of a layout.

14 Claims, 23 Drawing Sheets

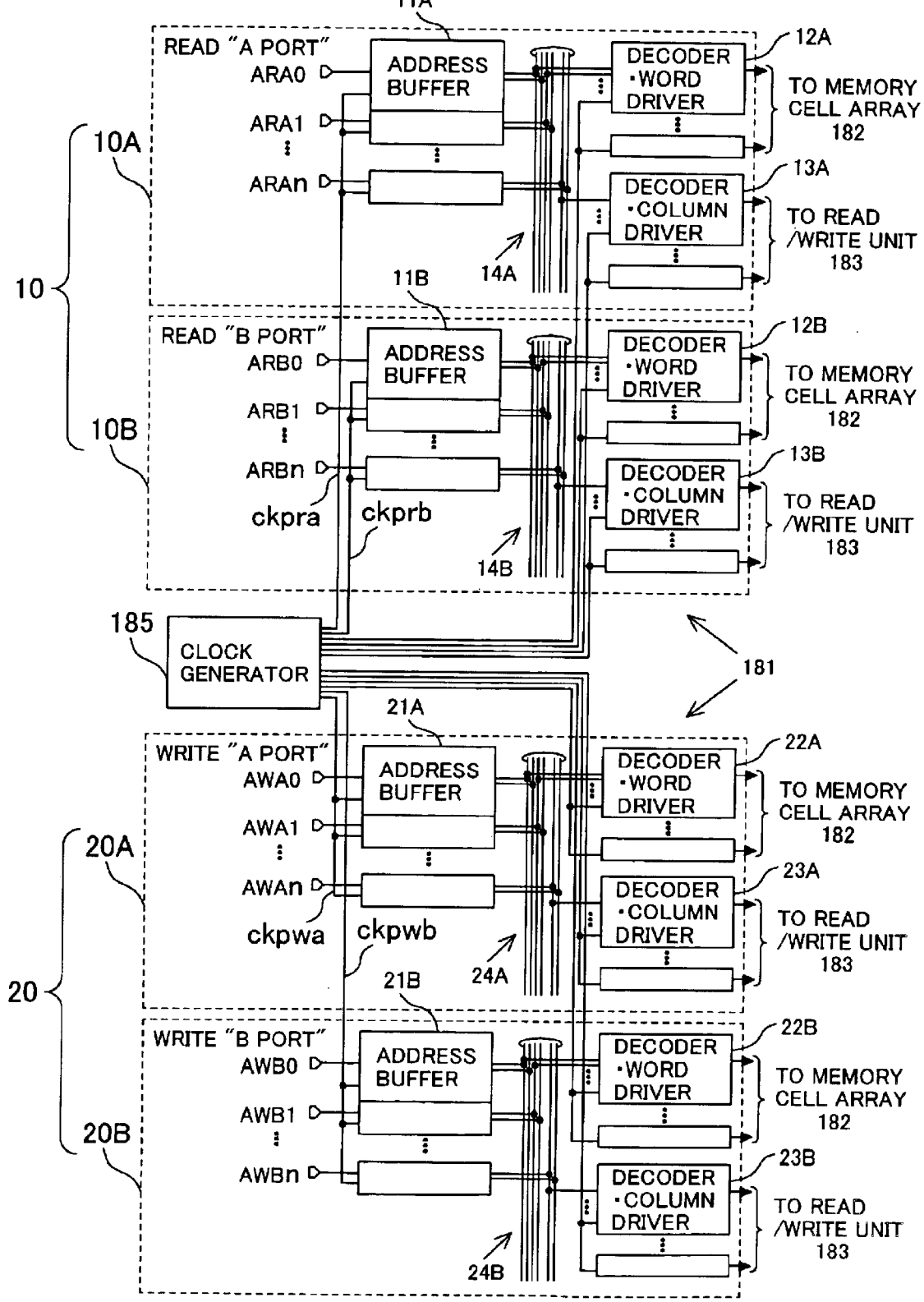

FIG.6A
<AT DESIGN PHASE>
WORD SELECTION SIGNAL
COLUMN SELECTION SIGNAL
FIG.6B
<AT ANALYSIS PHASE>
WORD SELECTION SIGNAL
COLUMN SELECTION SIGNAL
FIG.6C
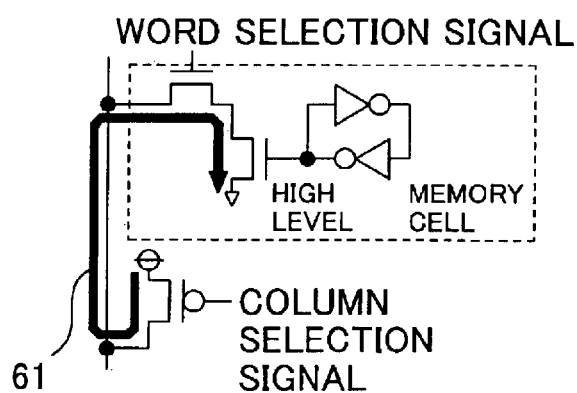
WORD SELECTION SIGNAL
HIGH LEVEL
MEMORY CELL
COLUMN SELECTION SIGNAL
61
FIG.6D
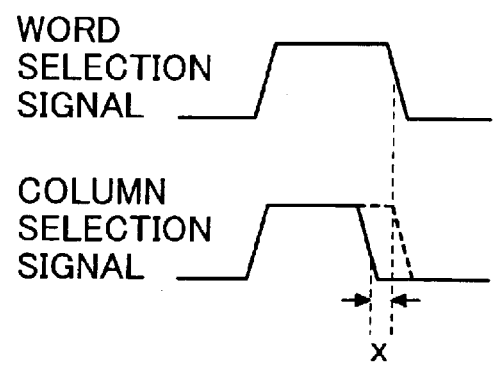
WORD SELECTION SIGNAL
COLUMN SELECTION SIGNAL
x

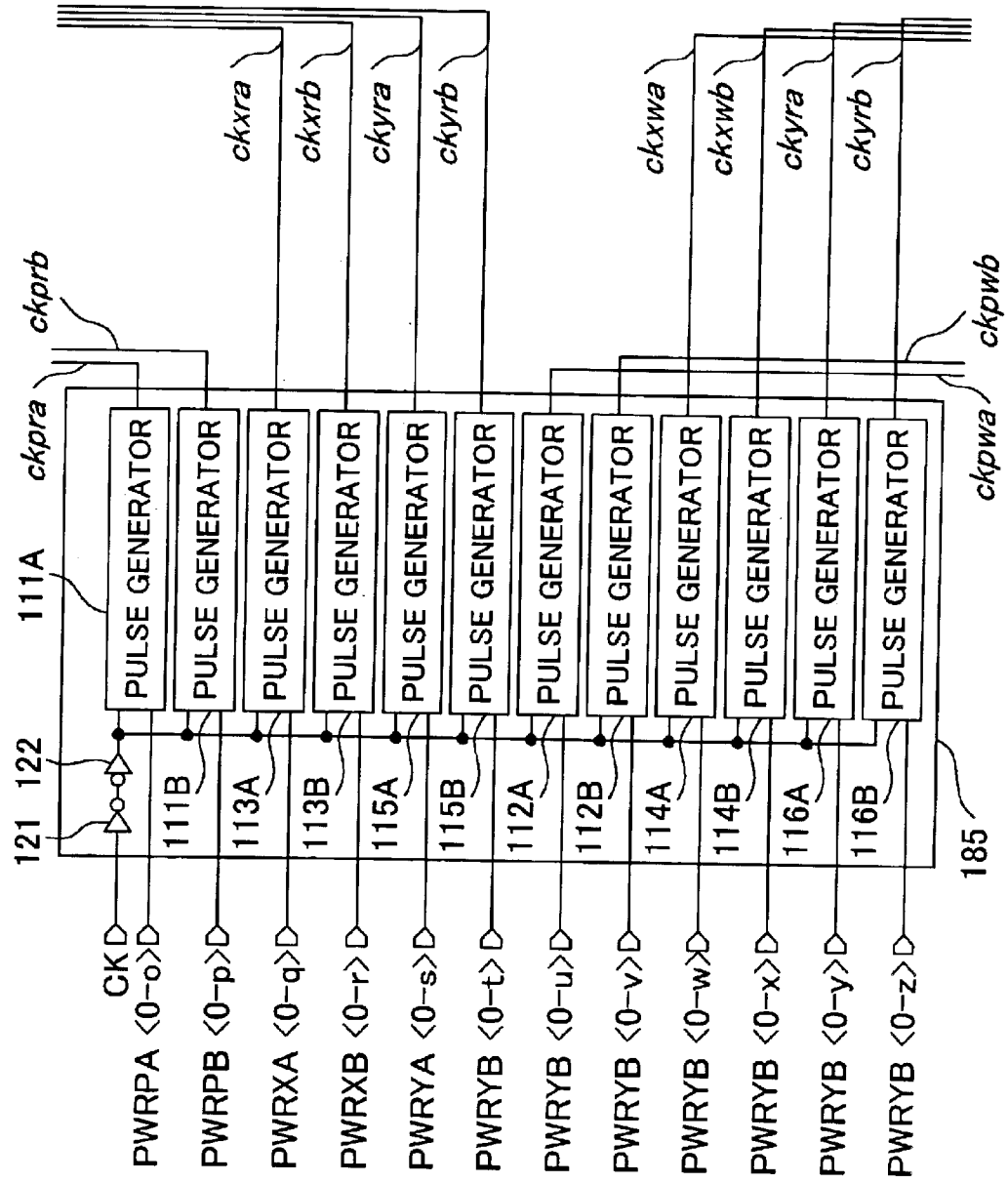

SEMICONDUCTOR MEMORY DEVICE

BACKGROUND OF THE INVENTION

1. Field of the Invention

In general, the present invention relates to a semiconductor memory device and a technology capable of evaluating a margin insufficiency of the pulse width of a clock signal in the semiconductor memory device and feeding a result of the evaluation back to a design phase with ease for, among other purposes, correction of the layout of the device based on the result. More particularly, the present invention relates to an effective technology applied to semiconductor memory devices including an SRAM (Static Random Access Memory).

2. Description of the Related Art

Documents such as Japanese Patent Laid-open No. 11-306758 have disclosed a semiconductor memory device comprising: a plurality of bit-line pairs provided for columns of a memory-cell array; a data-line pair for transferring data read out from the memory-cell array; a control means for selecting one of the bit-line pairs and for controlling an operation to sustain and stop a state of connection between the selected bit-line pair and the data-line pair in a read operation and a write operation; an equalize means operated during the period in which none of the bit-line pairs are connected to the data-line pair in a read operation to make electric potentials thereof equal to each other; and a write amplifier for driving the data-line pair in accordance with input data in a write operation; wherein, even if the period of the read operation coincides with the period of the write operation, the periods of connection between the selected bit-line pair and the data-line pair in the read operation and the write operation can be adjusted individually and, in addition, the period of connection between the selected bit-line pair and the data-line pair in the read operation can be adjusted independently of the period of connection between the selected bit-line pair and the data-line pair in the write operation and vice versa.

In accordance with the semiconductor memory device described above, since the periods of connection between the selected bit-line pair and the data-line pair in the read operation and the write operation can be adjusted individually and, in addition, the period of connection between the selected bit-line pair and the data-line pair in the read operation can be adjusted independently of the period of connection between the selected bit-line pair and the data-line pair in the write operation and vice versa even if the period of the read operation coincides with the period of the write operation as described above, the period of connection between the selected bit-line pair and the data-line pair in the read operation can be shortened while the period of connection between the selected bit-line pair and the data-line pair in the write operation can be lengthened so that data can be read out from the semiconductor memory device at a high speed and data can be written into the semiconductor memory device with a high degree of reliability.

In addition, documents such as Japanese Patent Laid-open No. 10-188555 have disclosed a technology capable of carrying out a high-speed operation at a high frequency by solving problems caused by mutually repulsive requests for a long data read period and a long data write period through employment of gates entering a conductive state for passing data in the data read and data write periods and employment of a control means for changing the conductive periods of the gates in the data read and data write periods.

In accordance with the technology disclosed in Japanese Patent Laid-open No. 11-306758 (also referred to as patent reference 1), the period of connection between the selected bit-line pair and the data-line pair in the read operation is made different from the period of connection between the selected bit-line pair and the data-line pair in the write operation in order to shorten the period of connection between the selected bit-line pair and the data-line pair in the read operation but lengthen the period of connection between the selected bit-line pair and the data-line pair in the write operation so that data can be read out from the semiconductor memory device at a high speed and data can be written into the semiconductor memory device with a high degree of reliability. In accordance with the technology disclosed in Japanese Patent Laid-open No. 10-188555 (also referred to as patent reference 2), on the other hand, a high-speed operation can be carried out at a high frequency by solving problems caused by mutually repulsive requests for a long data read period and a long data write period. Nevertheless, the technologies do not consider a procedure for evaluating a margin insufficiency of the pulse width of a clock signal and feeding back a result of the evaluation to a design phase for, among other purposes, correction of a layout on the basis of the result. Thus, at some locations in the semiconductor memory device, it is quite within the bounds of possibility that there has been a margin failure, which can otherwise be detected by carrying out an evaluation and/or an analysis. As another problem, it is difficult to verify a pulse width required at the location of the margin failure. In addition, the technologies disclosed in patent references 1 and 2 do not consider adjustment of the pulse width of a clock signal for each of main circuits composing a read in the semiconductor memory device or each of main circuits composing a write in the semiconductor memory device. As a result, it is difficult to improve the performance of the chip by adjusting the pulse width of a clock signal for each of the main circuits.

SUMMARY OF THE INVENTION

It is thus an object of the present invention to present a technology capable of evaluating a margin insufficiency of the pulse width of a clock signal and feeding back a result of the evaluation to a design phase with ease for, among other purposes, correction of a layout on the basis of the result.

It is another object of the present invention to present a technology capable of adjusting the pulse width of a clock signal for each of main circuits composing a read in a semiconductor memory device or each of main circuits composing a write in the semiconductor memory device.

The present invention as well as its other objects and its new characteristics will probably be better understood from a study of descriptions included in this specification and diagrams accompanying the descriptions.

The following description briefly explains an outline of representatives of inventions disclosed in this specification.

A semiconductor memory device comprises: a memory-cell array comprising a plurality of memory cells laid out therein as memory cells each capable of storing data; and a peripheral circuit operating in a data read operation to read out data from the memory-cell array or a data write operation to write data into the memory-cell array; wherein the semiconductor memory device further comprises a read generation circuit for generating a read clock signal to be supplied to the peripheral circuit in the data read operation to read out data from the memory-cell array; a write clock generation circuit for generating a write clock signal to be supplied to the peripheral circuit in the data write operation to write data into the memory-cell array; a read pulse-width adjustment circuit provided in the read clock generation circuit as a circuit for adjusting the pulse width of the read clock signal generated by the read clock generation circuit; and a write pulse-width adjustment circuit provided in the write clock generation circuit as a circuit for adjusting the pulse width of the write clock signal generated by the write clock generation circuit, wherein the pulse width of said read clock signal and said pulse width of said write clock signal are adjusted individually.

Since the read pulse-width adjustment circuit and the write pulse-width adjustment circuit are capable of individually adjusting the pulse widths of the read and write clock signals respectively, the pulse widths of the read and write clock signals can be adjusted to their respective optimum values. Thus, read and writes of the semiconductor memory device can be verified and evaluated with ease and results of the verification and the evaluation can be fed back to a design phase for, among other purposes, correction of a layout on the basis of the results.

A semiconductor memory device comprises: a memory-cell array comprising a plurality of memory cells laid out therein as memory cells each capable of storing data; a read circuit used in a data read operation to read out data from the memory-cell array; and a write circuit used in a data write operation to write data into the memory-cell array; wherein the semiconductor memory device further comprises a read clock generation circuit for generating a read clock signal to be supplied to the read circuit in the data read operation to read out data from the memory-cell array; a write clock generation circuit for generating a write clock signal to be supplied to the write circuit in the data write operation to write data into the memory-cell array; a read pulse-width adjustment circuit provided in the read clock generation circuit as a circuit for adjusting the pulse width of the read clock signal generated by the read clock generation circuit; and a write pulse-width adjustment circuit provided in the write clock generation circuit as a circuit for adjusting the pulse width of the write clock signal generated by the write clock generation circuit, wherein the pulse width of said read clock signal and said pulse width of said write clock signal are adjusted individually.

The read circuit and/or the write circuit may have a plurality of ports with any one of the ports allowing data to be read out from the memory-cell array and/or written into the memory-cell array in a manner independent of the other ports. In this case, the read pulse-width adjustment circuit or the write pulse-width adjustment circuit is provided for each of the ports.

A semiconductor memory device comprises: a memory-cell array comprising a plurality of memory cells laid out therein as memory cells each capable of storing data; a read circuit used in a data read operation to read out data from the memory-cell array; and a write circuit used in a data write operation to write data into the memory-cell array; wherein the semiconductor memory device further comprises a read clock generation circuit for generating a read clock signal to be supplied to the read circuit in the data read operation to read out data from the memory-cell array; a write clock generation circuit for generating a write clock signal to be supplied to the write circuit in the data write operation to write data into the memory-cell array; a read pulse-width adjustment circuit provided in the read clock generation circuit as a circuit for adjusting the pulse width of the read clock signal generated by the read clock generation circuit; and a write pulse-width adjustment circuit provided in the write clock generation circuit as a circuit for adjusting the pulse width of the write clock signal generated by the write clock generation circuit; wherein: the pulse width of said read clock signal and said pulse width of said write clock signal are adjusted individually; the read pulse-width adjustment circuit provided in the read clock generation circuit has a delay circuit for delaying an input signal and a logic gate for forming a waveform on the basis of a signal output by the delay circuit; and a plurality of aforementioned logic gates is provided at locations spread in the read circuit.

The read circuit may include: an address buffer for storing an address signal; a row-system decode circuit for generating a selection signal, which is used for selecting a row system, on the basis of the address signal stored in the address buffer; and a column-system decode circuit for generating a selection signal, which is used for selecting a column system, on the basis of the address signal stored in the address buffer; wherein one of the logic gates is provided for the row-system decode circuit included in the read circuit and another one of the logic gates is provided for the column-system decode circuit included in the read circuit.

The logic gate provided for the row-system decode circuit outputs a signal representing computed logic of a signal generated by the row-system decode circuit and a signal generated by the delay circuit, whereas the logic gate provided for the column-system decode circuit outputs a signal representing computed logic of a signal generated by the column-system decode circuit and a signal generated by the delay circuit.

A semiconductor memory device comprises: a memory-cell array comprising a plurality of memory cells laid out therein as memory cells each capable of storing data; a read circuit used in a data read operation to read out data from the memory-cell array; and a write circuit used in a data write operation to write data into the memory-cell array; wherein the semiconductor memory device further comprises a read clock generation circuit for generating a read clock signal to be supplied to the read circuit in the data read operation to read out data from the memory-cell array; a write clock generation circuit for generating a write clock signal to be supplied to the write circuit in the data write operation to write data into the memory-cell array; a read pulse-width adjustment circuit provided in the read clock generation circuit as a circuit for adjusting the pulse width of the read clock signal generated by the read clock generation circuit; and a write pulse-width adjustment circuit provided in the write clock generation circuit as a circuit for adjusting the pulse width of the write clock signal generated by the write clock generation circuit; wherein: the pulse width of said read clock signal and said pulse width of said write clock signal are adjusted individually; the read pulse-width adjustment circuit provided in the read clock generation circuit has a delay circuit for delaying an input signal and a logic gate for forming a waveform on the basis of a signal output by the delay circuit; and a plurality of aforementioned logic gates is provided at locations spread in the write circuit.

The write circuit may include: an address buffer for storing an address signal; a row-system decode circuit for generating a selection signal, which is used for selecting a row system, on the basis of the address signal stored in the address buffer; and a column-system decode circuit for generating a selection signal, which is used for selecting a column system, on the basis of the address signal stored in the address buffer; wherein one of the logic gates is provided for the row-system decode circuit included in the write circuit and another one of the logic gates is provided for the column-system decode circuit included in the write circuit.

The logic gate provided for the row-system decode circuit outputs a signal representing computed logic of a signal generated by the row-system decode circuit and a signal generated by the delay circuit, whereas the logic gate provided for the column-system decode circuit outputs a signal representing computed logic of a signal generated by the column-system decode circuit and a signal generated by the delay circuit.

Each of the pulse-width adjustment circuit has a delay adjustment circuit for adjusting a signal delay of the delay circuit and the delay adjustment circuit includes a fuse circuit for determining a state of a control signal for adjusting the signal delay of the delay circuit.

Each of the pulse-width adjustment circuit has a delay adjustment circuit for adjusting a signal delay of the delay circuit and the delay adjustment circuit includes a flip-flop circuit for determining a state of a control signal for adjusting the signal delay of the delay circuit.

BRIEF DESCRIPTION OF THE DRAWINGS

FIG. 5 is a block diagram showing a typical circuit configuration of an SRAM having 2 ports for a read and 2 ports for a write;

FIG. 6 is an explanatory diagram referred to in describing effects exhibited by the SRAM;

FIG. 23 is a block diagram showing a detailed typical configuration of a clock generator shown in FIG. 5.

DESCRIPTION OF THE PREFERRED EMBODIMENTS

Figure 18:
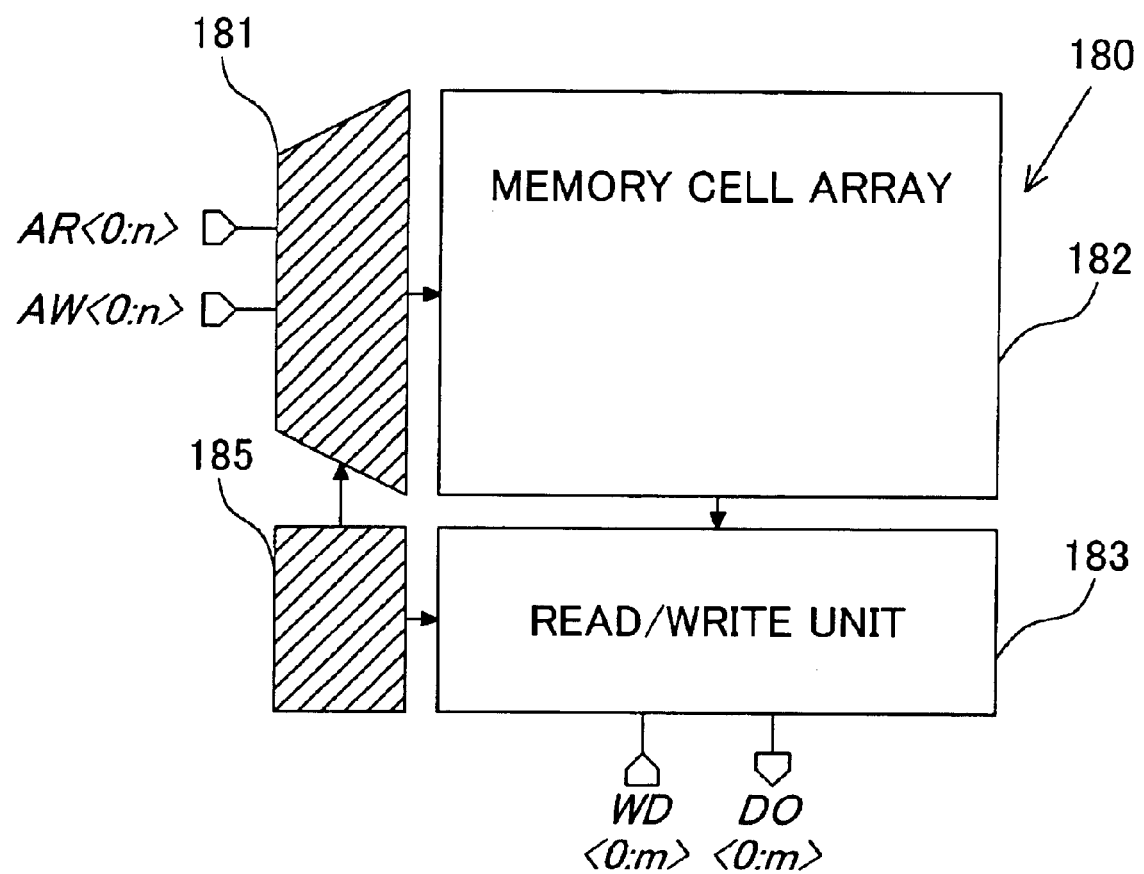
FIG. 18 is a block diagram showing an overall configuration of the SRAM.

FIG. 18 is a diagram showing a static random access memory 180 (abbreviated hereafter to an SRAM) provided by the present invention as a typical semiconductor memory device. The SRAM 180 shown in FIG. 18 is designed typically as a multi-port SRAM having a read port and a write port, which operate independently of each other. However, the SRAM provided by the present invention does not have to be a multi-port SRAM in particular. The SRAM 180 comprises a memory-cell array 182 and peripheral circuits, which typically include a decode unit 181, a read/write unit 183 and a clock generator 185. The SRAM 180 is created on a semiconductor substrate such as a single-crystal silicon substrate by adoption of a semiconductor integrated-circuit fabrication technology, which is commonly known.

The SRAM 180 includes a plurality of word lines and a plurality of bit lines. The memory-cell array 182 is an array comprising a plurality of static-type memory cells each located at the intersection of any one of the word lines and any one of the bit lines.

The decode unit 181 includes a means for decoding a read-use address AR <0:n>, selecting one of the word lines in accordance with a result of decoding and generating a signal for driving the selected word line to a select level. By the same token, the decode unit 181 also includes a means for decoding a write-use address AW <0:n>, selecting one of the word lines in accordance with a result of decoding and generating a signal for driving the selected word line to the select level. When a specific one of the word lines is driven to the select level by the signal generated by the decode unit 181, data stored in the particular memory cells that are connected to the specific world line can be read out through the specific world line, and data can be written into the particular memory cells by way of the specific world line. The data read out from the particular memory cells is propagated to the bit lines and can be output to an external reading device by way of the read/write unit 183.

The read/write unit 183 comprises a read column select circuit for selecting a bit line, a read amplifier circuit for amplifying data read out from the memory-cell array 182 through the read column select circuit, a write amplifier for amplifying data to be written into the memory-cell array 182 and a write-use column select circuit for connecting the write amplifier to a bit line selected as a bit line for write use. Symbol DO <0:m> denotes data read out from memory cells whereas symbol WD <0:m> denotes data being written into memory cells.

The clock generator 185 generates a read-use clock signal and a write-use clock signal, which are supplied to the decode unit 181.

Figure 19:
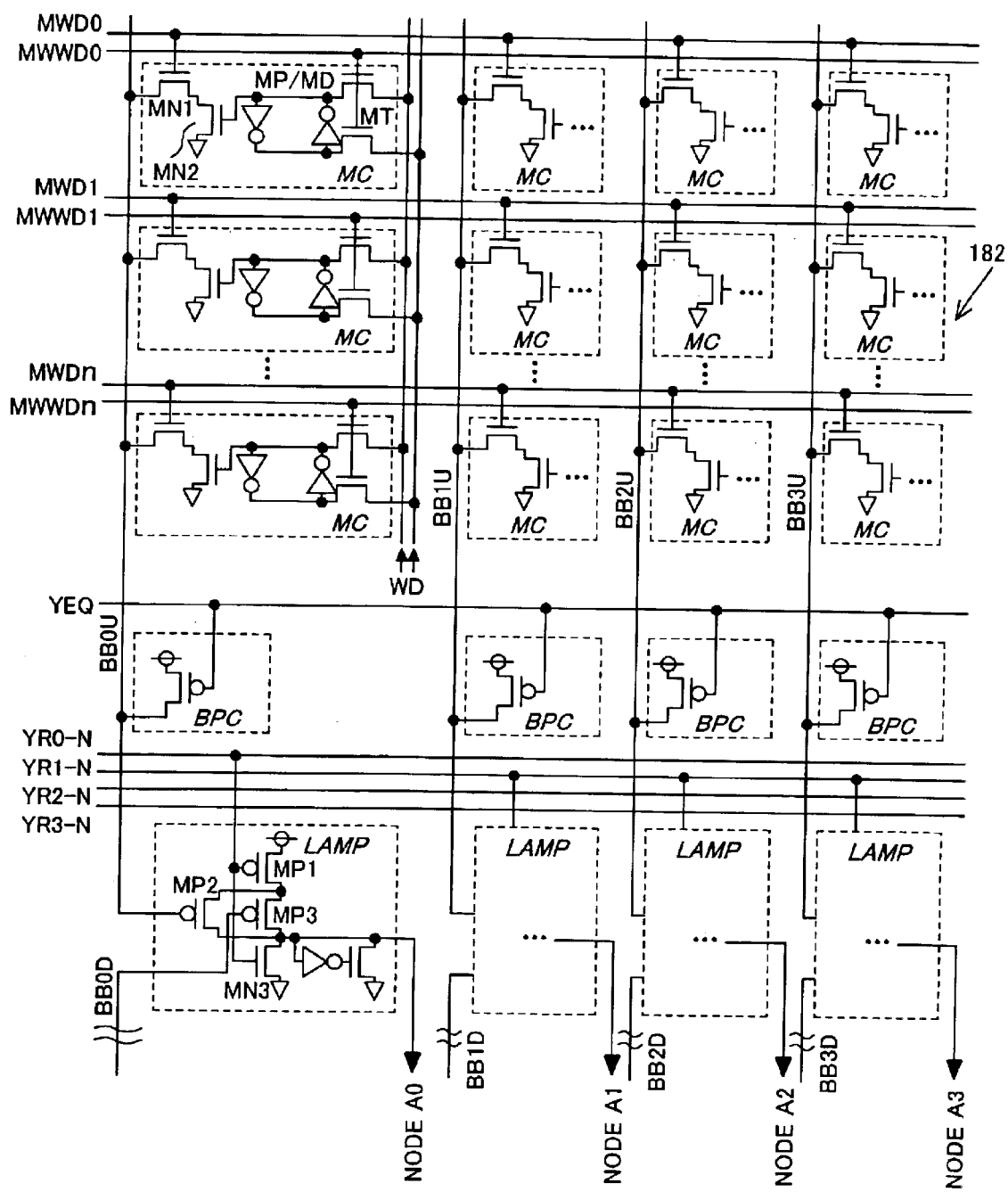
FIG. 19 is a block diagram showing a still further typical circuit configuration comprising the main components employed in the SRAM.

FIG. 19 is a diagram showing a typical configuration of the memory-cell array 182.

The memory cells MC are each provided at the intersection of one of the word lines and one of the bit lines to form a matrix. Memory cells MC connected to the leftmost bit line are shown as representative memory cells. These representative memory cells CM are each a 2-port memory cell comprising 8 MOS transistors. To put it in detail, as is obvious from a representative memory cell MC at the left top corner of the figure, the memory cell MC has a storage unit. This storage unit is a latch circuit implemented by 2 CMOS inverter circuits each comprising a p-channel load MOS transistor MP and an n-channel driving MOS transistor MD. The output of the first CMOS inverter is connected to the input of the second CMOS inverter and the input of the first CMOS inverter is connected to the output of the second CMOS inverter. The memory cell MC has a 2-port configuration including a write path and a read path, which are provided for the storage unit.

The write path includes a pair of MOS transistors MT provided between mutually complementary write-use bit lines as transistors for address-selection use. On the other hand, the read path comprises an n-channel MOS transistor MN2 and an n-channel MOS transistor MN1 for address-selection use. An information voltage appearing at one of storage nodes in the latch circuit is supplied to the gate of the n-channel MOS transistor MN2 whereas the ground electric potential is applied to the source of the n-channel MOS transistor MN2. The n-channel MOS transistor MN1 is provided between the drain of the n-channel MOS transistor MN2 and a read-use bit line BB0U. The gates of the MOS transistors MT serving as the pair of MOS transistors MT composing the write path are connected to a write-use word line MWWD0 while the gate of the N-channel MOS transistor MN1 is connected to a read-use word line MWD0.

The read-use bit line BB0U is connected to a bit-line precharge circuit BPC, which is a p-channel MOS transistor receiving a timing signal YEQ. A read signal appearing on the read-use bit line BB0U is amplified by a LAMP (local amplifier), which is also known as a sense amplifier. The local amplifier LAMP is an inversion amplifying circuit, which also functions as a column select circuit. That is to say, the read-use bit line BB0U is connected to the gate of a p-channel amplifying MOS transistor MP2 employed in the local amplifier LAMP. The drain and the source of the MOS transistor MP2 are connected respectively to a p-channel MOS transistor MP1 and an n-channel MOS transistor MN3, which are switched on and off under control based on a column selection signal YR0-N.

When turned on by the column selection signal YR0-N, the n-channel MOS transistor MN3 becomes a load device of the MOS transistor MP2, which serves as an amplifying device. On the other hand, the p-channel MOS transistor MP1 is used as a switch for supplying an operation voltage. The drain of the p-channel amplifying MOS transistor MP2 is connected to an inverter circuit and a low-level latch circuit implemented by an n-channel MOS transistor.

For the sake of large-scale integration of circuits, in this embodiment, bit lines are laid out above and below the local amplifiers LAMP. However, such a layout of bit lines is not specially mandatory. The figure shows bit lines BB0U to BB3U as typical representative bit lines laid out above the local amplifiers LAMP and bit lines BB0D to BB3D as typical representative bit lines laid out below the local amplifiers LAMP. For the bit lines BB0D to BB3D, neither memory cells MC nor precharge circuits BPC are shown. In order to sense signals appearing on the pair of bit lines BB0U and BB0D, the local amplifier LAMP is provided with the amplifying MOS transistors MP2 and MP3, which are connected to form a parallel circuit. The gates of the amplifying MOS transistors MP2 and MP3 are connected to the bit lines BB0U and BB0D respectively.

By providing the local amplifier LAMP to bit lines BB0U and BB0D, which are laid out above and below the local amplifiers LAMP, as described above, in essence, the lengths of the bit lines BB0U and BB0D can be reduced to halves so that the parasitic capacitances and the like of the bit lines BB0U and BB0D can also be reduced to halves, resulting in a merit of high speed read operations. In this configuration, there are a memory-cell array portion on the upper side as well as a memory-cell array portion on the lower side, and a word line of either the memory-cell array portion on the upper side or the memory-cell array portion on the lower side is selected.

Figure 1:
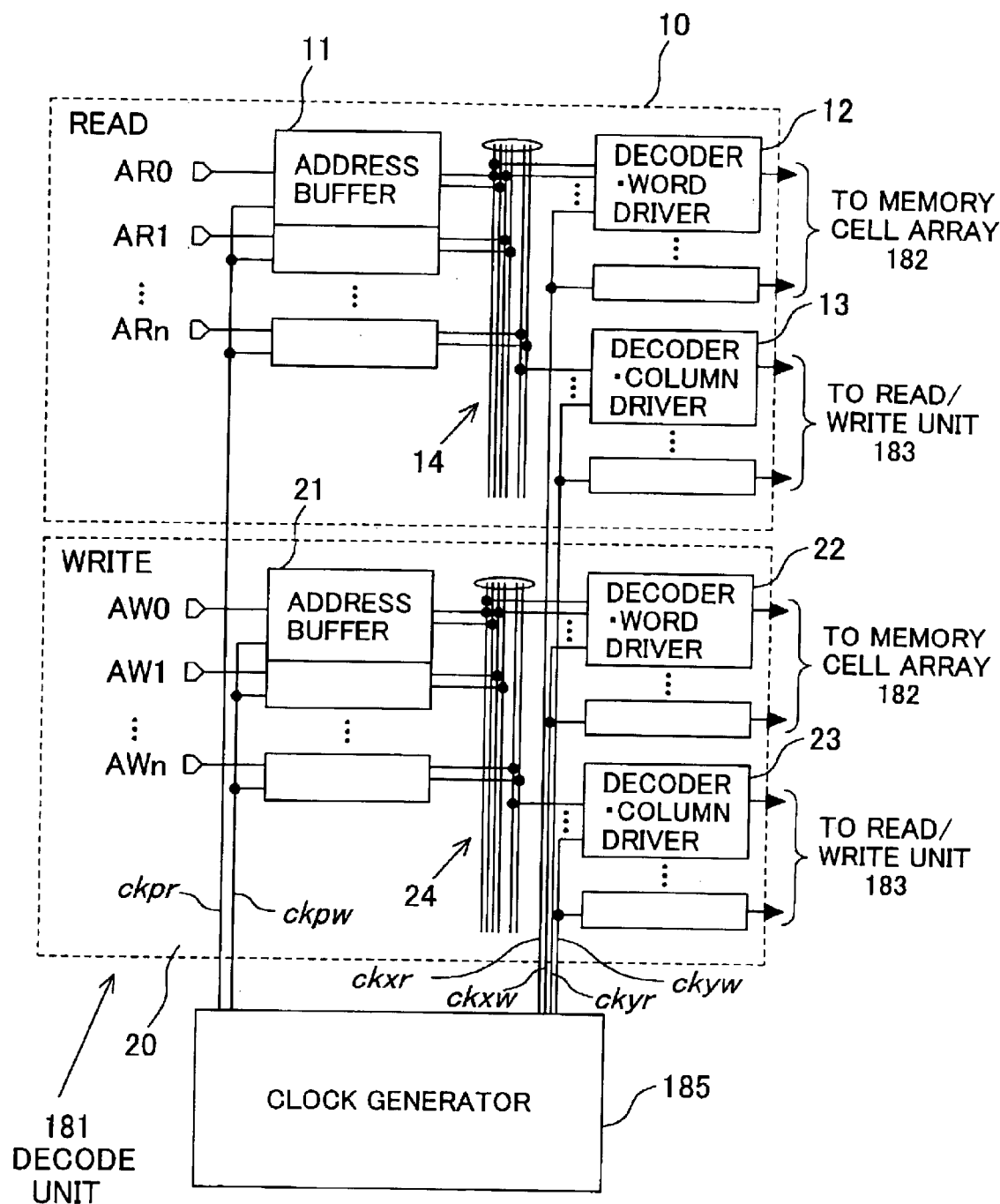
FIG. 1 is a block diagram showing a typical circuit configuration comprising main components employed in an SRAM serving as a typical semiconductor memory device provided by the present invention.
Figure 22:
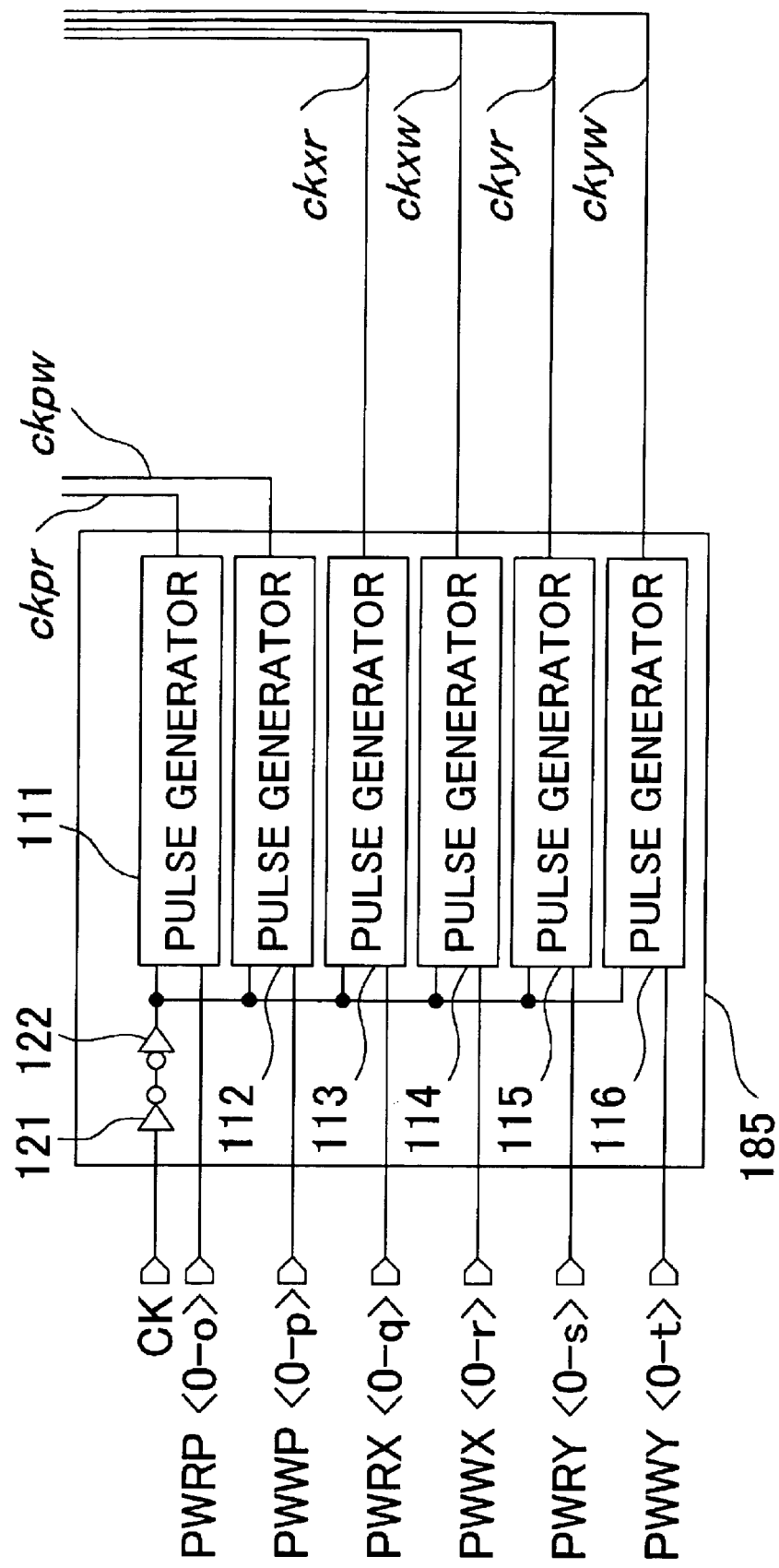
FIG. 22 is a block diagram showing a detailed typical configuration of a clock generator shown in FIGS. 18 and 1.

FIG. 1 is a diagram showing a typical configuration of the decode unit 181 whereas FIG. 22 is a diagram showing a typical configuration of the clock generator 185.

The decode unit 181 includes a read-use decoder 10 used in an operation to read data from the memory-cell array 182 and a write-use decoder 20 used in an operation to write data into the memory-cell array 182.

The read-use decoder 10 includes a plurality of read-address buffers 11, a plurality of read-word decoders/drivers 12, a plurality of read-column decoders/drivers 13 and read decode lines 14.

The read-address buffers 11 are used for storing read-use address signals AR0 to ARn, which are received from an external source, synchronously with a clock signal ckpr provided for, the read-address buffers 11. Signals output by the read-address buffers 11 are supplied to the read-word decoders/drivers 12 and the read-column decoders/drivers 13 through the read decode lines 14. The read-word decoders/drivers 12 include a read word decoder for decoding the signals received from the read decode lines 14 and a read word driver for driving a word line to a select level on the basis of a decoding result generated by the read word decoder. The read word decoder and the read word driver are not shown in the figure though. The read word driver drives a word line to the select level synchronously with a clock signal ckxr provided for the read word driver. The read-column decoders/drivers 13 include a read column decoder for decoding the signals received from the read decode lines 14 and a read column driver for driving a read column select circuit, which is employed in the read/write unit 183, on the basis of a decoding result generated by the read column decoder. The read column decoder and the read column driver are not shown in the figure though. The read column driver drives the read column select circuit synchronously with a clock signal ckyr provided for the read column driver.

By the same token, the write-use decoder 20 includes a plurality of write-address buffers 21, a plurality of write-word decoders/drivers 22, a plurality of write-column decoders/drivers 23 and write decode lines 24.

The write-address buffers 21 are used for storing write-use address signals AW0 to AWn, which are received from an external source, synchronously with a clock signal ckpw provided for the write-address buffers 21. Signals output by the write-address buffers 21 are supplied to the write-word decoders/drivers 22 and the write-column decoders/drivers 23 through the write decode lines 24. The write-word decoders/drivers 22 include a write word decoder for decoding the signals received from the write decode lines 24 and a write word driver for driving a word line to a select level on the basis of a decoding result generated by the write word decoder. The write word decoder and the write word driver are not shown in the figure though. The write word driver drives a word line to the select level synchronously with a clock signal ckxw provided for the write word driver. The write-column decoders/drivers 23 include a write column decoder for decoding the signals received from the write decode lines 24 and a write column driver for driving a write column select circuit, which is employed in the read/write unit 183, on the basis of a decoding result generated by the write column decoder. The write column decoder and the write column driver are not shown in the figure though. The write column driver drives the write column select circuit synchronously with a clock signal ckyw provided for the write column driver.

The clock generator 185 comprises inverters 121 and 122 as well as pulse generators 111 to 116. A clock signal CK received from an external source is supplied to the pulse generators 111 to 116 by way of the inverters 121 and 122.

The pulse generator 111 generates the clock signal ckpr for the read-address buffers 11 on the basis of a signal output by the inverter 122. The pulse width of the clock signal ckpr for the read-address buffers 11 can be adjusted by using a pulse-width control signal PWRP <0-o>.

The pulse generator 112 generates the clock signal ckpw for the read-address buffers 11 on the basis of a signal output by the inverter 122. The pulse width of the clock signal ckpw for the write-address buffers 21 can be adjusted by using a pulse-width control signal PWRP <0-p>.

The pulse generator 113 generates the clock signal ckxr for the read-word driver on the basis of a signal output by the inverter 122. The pulse width of the clock signal ckxr for the read-word driver can be adjusted by using a pulse-width control signal PWRX <0-q>.

The pulse generator 114 generates the clock signal ckxw for the write-word driver on the basis of a signal output by the inverter 122. The pulse width of the clock signal ckxw for the write-word driver can be adjusted by using a pulse-width control signal PWRX <0-r>.

The pulse generator 115 generates the clock signal ckyr for the read-column driver on the basis of a signal output by the inverter 122. The pulse width of the clock signal ckyr for the read-column driver can be adjusted by using a pulse-width control signal PWRY <0-s>.

The pulse generator 116 generates the clock signal ckyw for the write-column driver on the basis of a signal output by the inverter 122. The pulse width of the clock signal ckyw for the write-column driver can be adjusted by using a pulse-width control signal PWWY <0-t>.

The pulse generators 111 to 116 have the same configuration. However, the pulse generators 111 to 116 do not specially have to have the same configuration.

Figure 20:
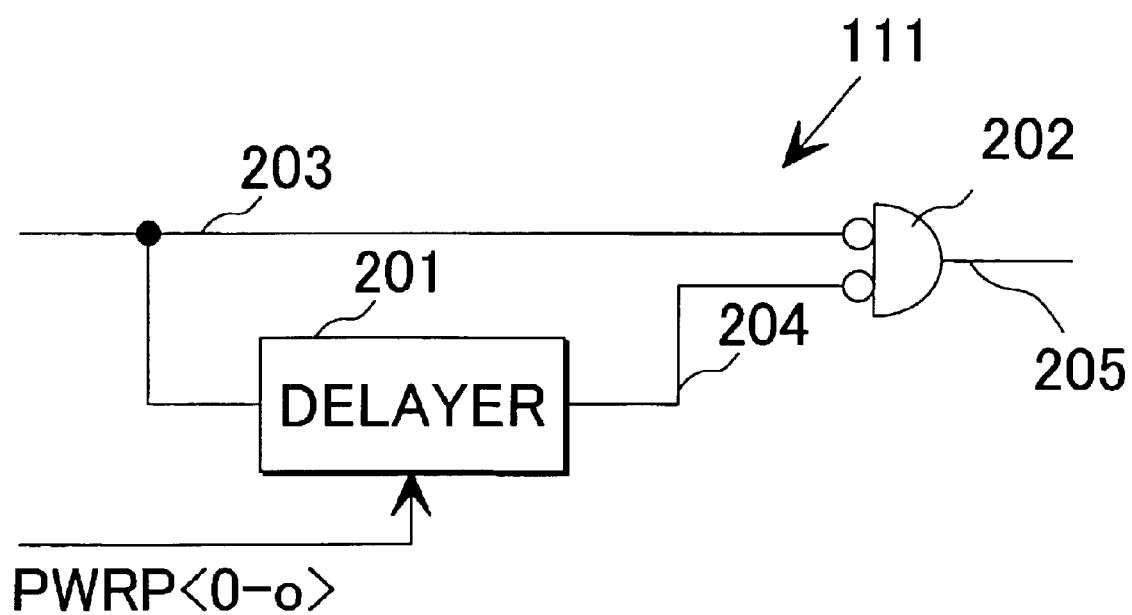
FIG. 20 is a diagram showing a typical circuit configuration of a pulse generator employed in the SRAM.
Figure 21:
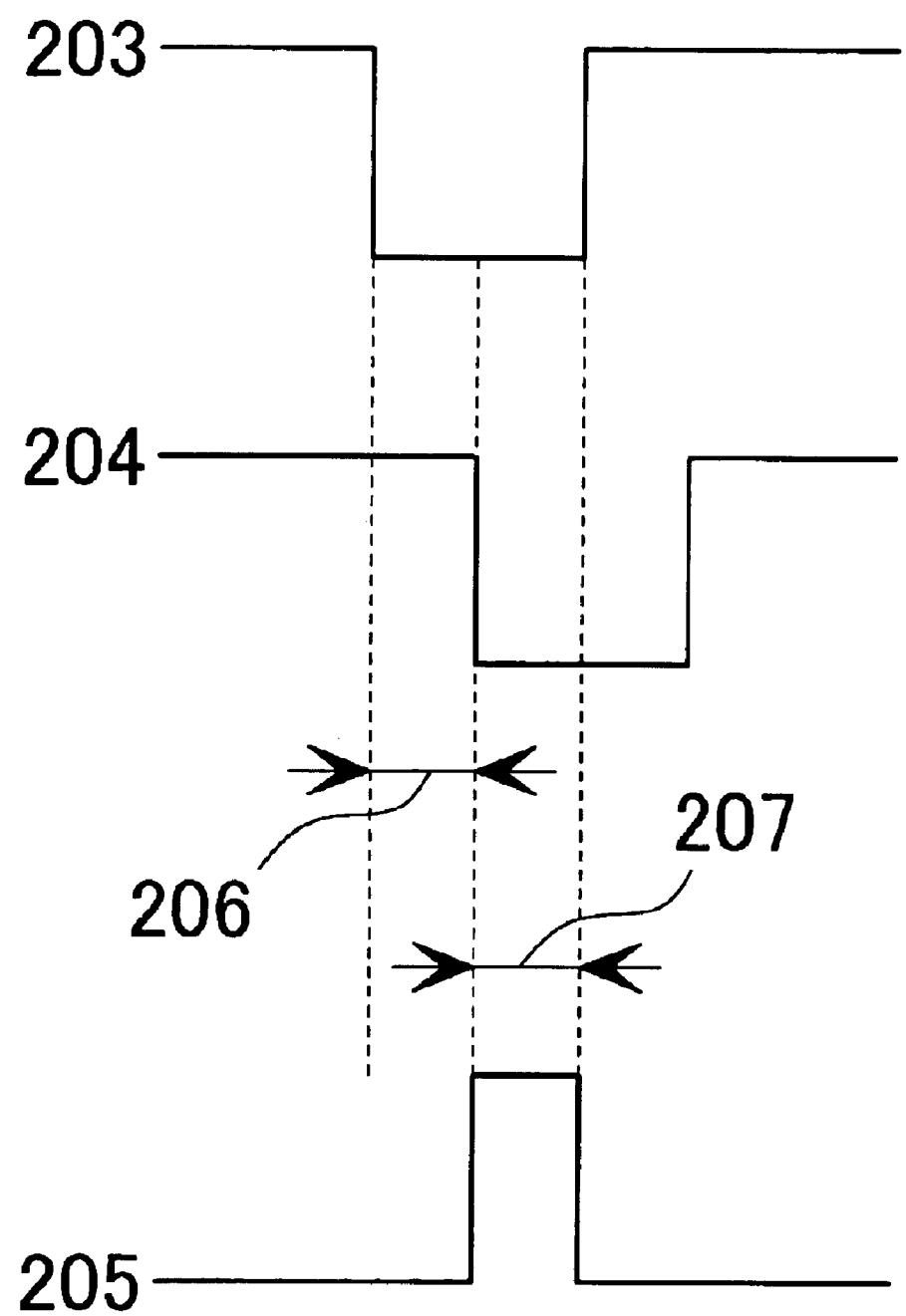
FIG. 21 is an operation timing diagram of the main components employed in the pulse generator shown in FIG. 20.

FIG. 20 is a diagram showing a typical configuration of the pulse generator 111 as a representative of the pulse generators 111 to 116. FIG. 21 shows waveforms of operation signals of main components employed in the pulse generator 111 shown in FIG. 20.

As shown in FIG. 20, the pulse generator 111 comprises a delayer (a delay circuit) 201 and a gate circuit 202. The delayer 201 is a component for delaying a clock signal 203 propagating through the inverters 121 and 122. The gate circuit 202 is a component for obtaining NOR logic of the clock signal 203 and a signal 204 output by the delayer 201. The pulse width 207 of a signal 205 (ckpr) output by the gate circuit 202 is determined by the delay time of the delayer 201. The delay time of the delayer 201 can be adjusted by the pulse-width control signal PWRP <0-o>.

Figure 12:
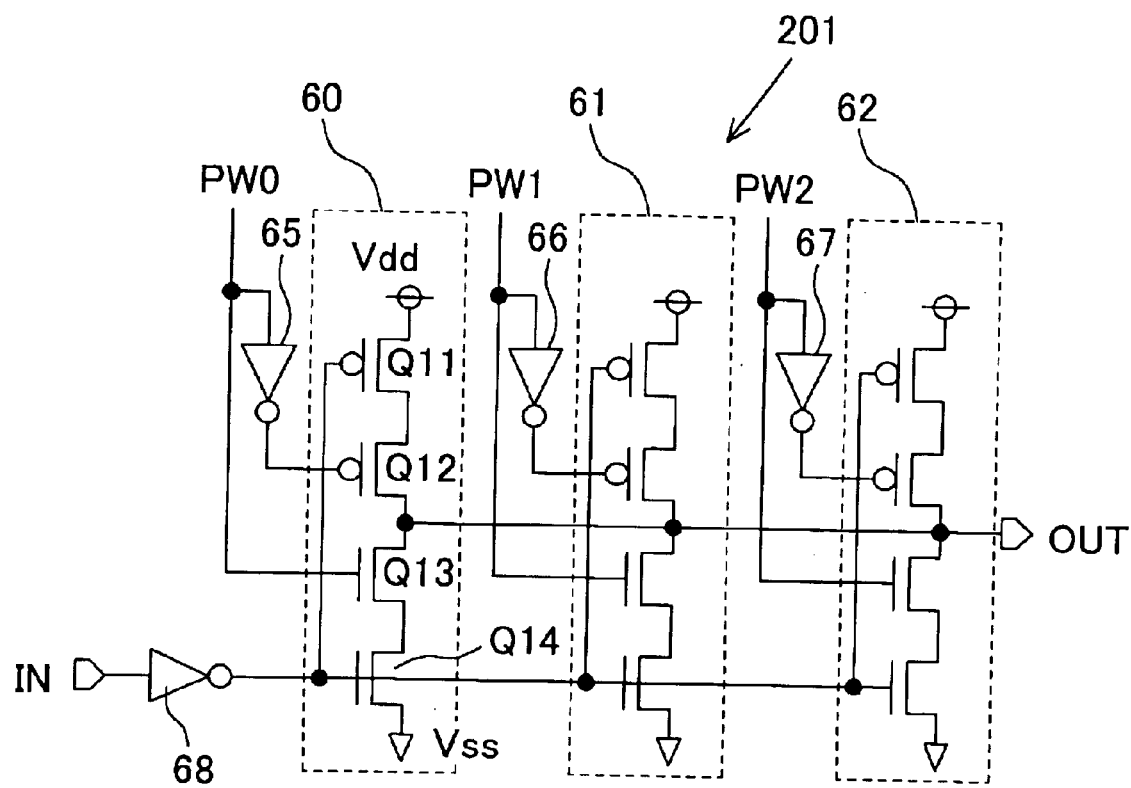
FIG. 12 is a diagram showing a typical circuit configuration of a delayer employed in the SRAM.
Figure 13:
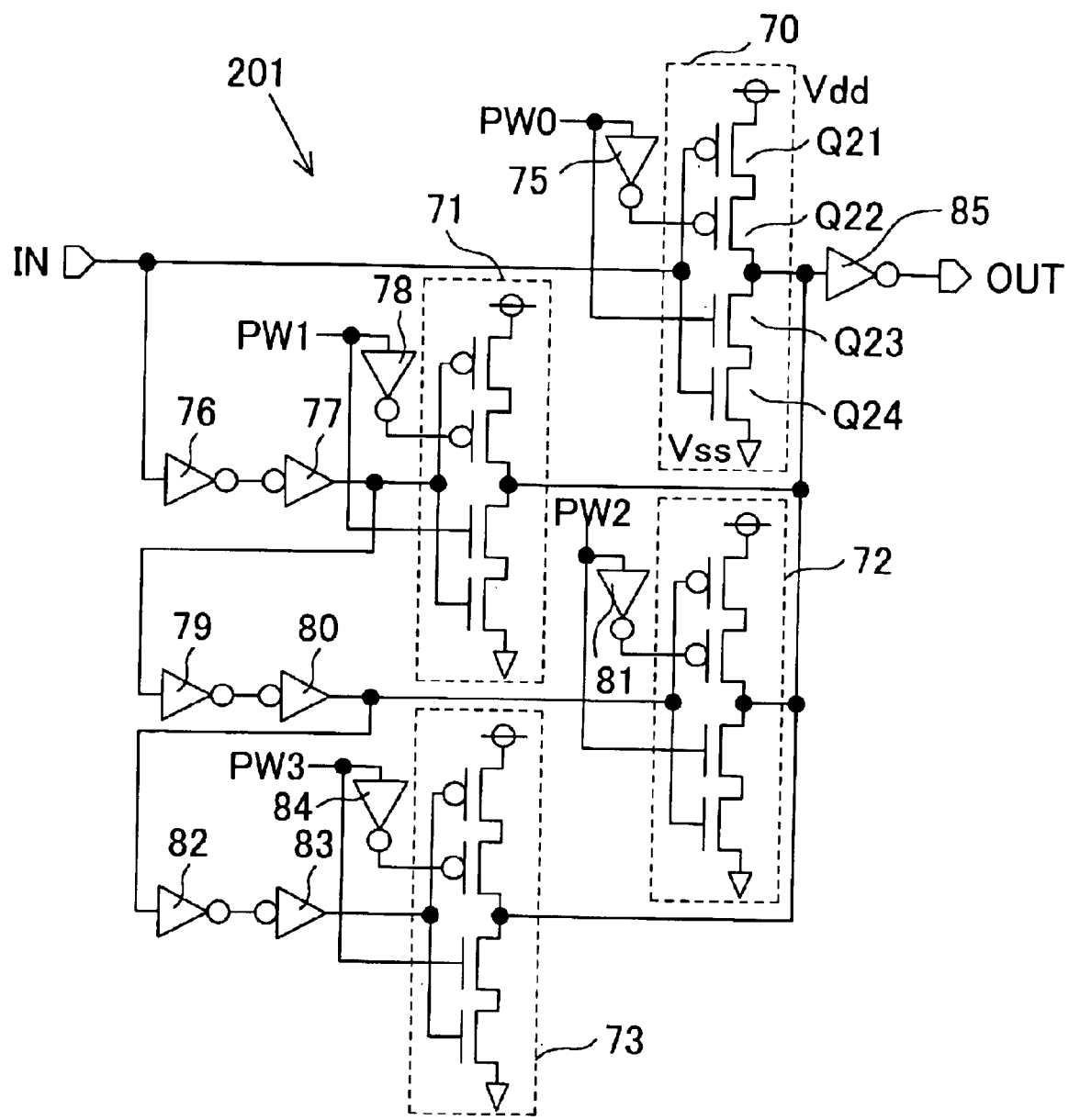
FIG. 13 is a diagram showing another typical circuit configuration of the delayer employed in the SRAM.
Figure 14:
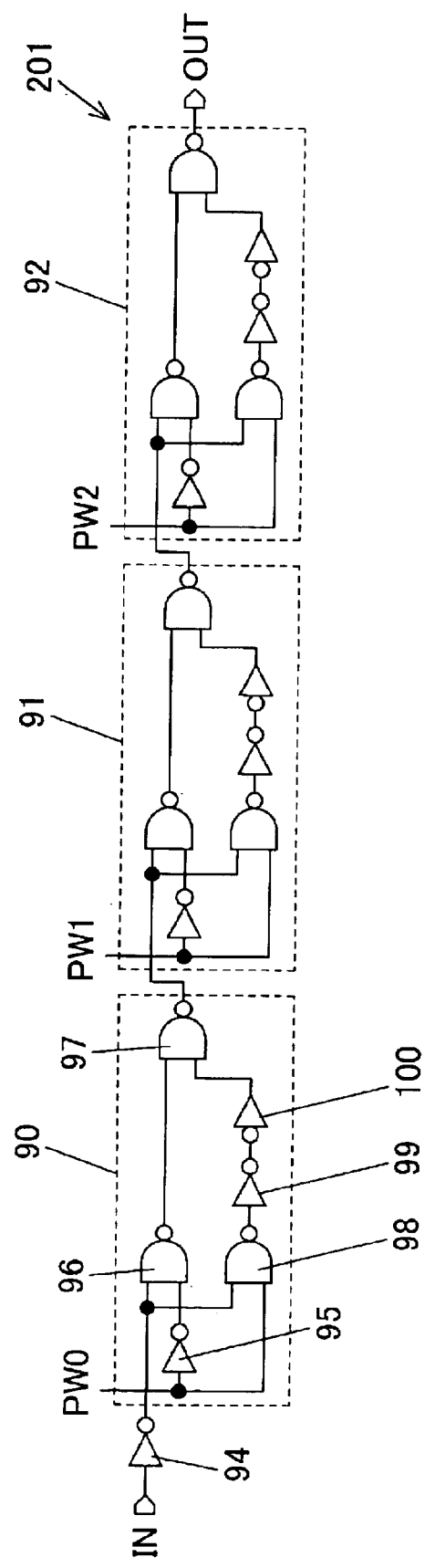
FIG. 14 is a diagram showing a further typical circuit configuration of the delayer employed in the SRAM.

FIGS. 12, 13 and 14 are each a diagram showing a typical configuration of the delayer 201.

In the typical configuration shown in FIG. 12, the delayer 201 comprises drivers 60, 61 and 62 as well as inverters 65, 66, 67 and 68 connected to the drivers 60, 61 and 62. Each of the drivers 60, 61 and 62 comprises p-channel MOS transistors Q11 and Q12 as well as n-channel MOS transistors Q13 and Q14. The transistors Q11, Q12, Q13 and Q14 are connected to each other to form a series circuit. The sizes of the gates of the transistors Q11, Q12, Q13 and Q14 are adjusted to provide the drivers 60, 61 and 62 with drivabilities different from each other. The source electrode of the p-channel MOS transistor Q11 is connected to a power supply Vdd on the high electric potential side. On the other hand, the source electrode of the n-channel MOS transistor Q14 is connected to a power supply Vss on the low electric potential side. The gate electrode of the p-channel MOS transistor Q11 and the gate electrode of the n-channel MOS transistor Q14 are connected to an input terminal IN by the inverter 68. A clock signal CK denoted by reference numeral 203 is supplied to the input terminal IN. Pulse-width control signals PW0, PW1 and PW2 corresponding to, for example, the pulse-width control signal PWRP <0-o>shown in FIG. 20 are supplied to the gate electrodes of the n-channel MOS transistors Q13 employed in the drivers 60, 61 and 62 respectively. The pulse-width control signals PW0, PW1 and PW2 are also supplied to the gate electrodes of the p-channel MOS transistors Q12 employed in the drivers 60, 61 and 62 respectively by way of the inverters 65, 66 and 67 respectively. As a result, the drivers 60, 61 and 62 are activated selectively in accordance with a logic combination of the pulse-width control signals PW0, PW1 and PW2.

A connection node between the p-channel MOS transistor Q12 and the n-channel MOS transistor Q13 in the series circuit in the driver 60 is connected to an output terminal OUT. By the same token, a connection node between the p-channel MOS transistor Q12 and the n-channel MOS transistor Q13 in the series circuit in the driver 61 is also connected to the output terminal OUT. In the same way, a connection node between the p-channel MOS transistor Q12 and the n-channel MOS transistor Q13 in the series circuit in the driver 62 is connected to the output terminal OUT as well. Since the drivers 60, 61 and 62 are provided with drivabilities different from each other, by selectively activating the drivers 60, 61 and 62, a clock signal appearing at the output terminal OUT can be switched from one rising-edge characteristic to another as well as from one falling-edge characteristic to another. As a result, the delay time (or the magnitude of the delay) of the clock signal can be changed.

In the typical configuration shown in FIG. 13, the delayer 201 comprises drivers 70, 71, 72 and 73 as well as inverters 75 to 85 connected to the drivers 70, 71, 72 and 73. Each of the drivers 70, 71, 72 and 73 comprises p-channel MOS transistors Q21 and Q22 as well as n-channel MOS transistors Q23 and Q24. Much like the drivers 60, 61 and 62 shown in FIG. 12, the transistors Q21, Q22, Q23 and Q24 are connected to each other to form a series circuit. The source electrode of the p-channel MOS transistor Q21 is connected to a power supply Vdd on the high electric potential side. On the other hand, the source electrode of the n-channel MOS transistor Q24 is connected to a power supply Vss on the low electric potential side. Pulse-width control signals PW0, PW1, PW2 and PW3 are supplied to the gate electrodes of the n-channel MOS transistors Q23 employed in the drivers 70, 71, 72 and 73 respectively. The pulse-width control signals PW0, PW1, PW2 and PW3 are also supplied to the gate electrodes of the p-channel MOS transistors Q22 employed in the drivers 70, 71, 72 and 73 respectively by way of the inverters 75, 78, 81 and 84 respectively. In the driver 70, the gate electrode of the p-channel MOS transistor Q21 and the gate electrode of the n-channel MOS transistor Q24 are connected directly to an input terminal IN. In the driver 71, the gate electrode of the p-channel MOS transistor Q21 and the gate electrode of the n-channel MOS transistor Q24 are connected to the input terminal IN by the inverters 76 and 77. In the driver 72, the gate electrode of the p-channel MOS transistor Q21 and the gate electrode of the n-channel MOS transistor Q24 are connected to the input terminal IN by the inverters 76, 77, 79 and 80. In the driver 73, the gate electrode of the p-channel MOS transistor Q21 and the gate electrode of the n-channel MOS transistor Q24 are connected to the input terminal IN by the inverters 76, 77, 79, 80, 82 and 83. A clock signal is supplied to the input terminal IN.

When any specific one of the pulse-width control signals PW0, PW1, PW2 and PW3 is set to a high level, one of the drivers 70, 71, 72 and 73 that is associated with the specific pulse-width control signal is activated to allow the clock signal to propagate with a delay time determined by the number of inverters through which the clock signal propagates. For example, assume that the pulse-width control signal PW0 is set to a high level. In this case, the clock signal supplied to the input terminal IN is passed on to a circuit at the next stage by way of the driver 70 and the inverter 85. If the pulse-width control signal PW1 is set to a high level, on the other hand, the clock signal supplied to the input terminal IN is passed on to the circuit at the next stage by way of the inverters 76 and 77, the driver 71 as well as the inverter 85. By the same token, if the pulse-width control signal PW2 is set to a high level, the clock signal supplied to the input terminal IN is passed on to the circuit at the next stage by way of the inverters 76, 77, 79 and 80, the driver 72 as well as the inverter 85. In the same way, if the pulse-width control signal PW3 is set to a high level, the clock signal supplied to the input terminal IN is passed on to the circuit at the next stage by way of the inverters 76, 77, 79, 80, 82 and 83, the driver 73 as well as the inverter 85.

In the typical configuration shown in FIG. 14, the delayer 201 comprises an inverter 94 as well as delay stages 90, 91 and 92. The delay stages 90, 91 and 92 are connected to each other to form a series circuit. A clock signal supplied to an input terminal IN propagates to an output terminal OUT by way of the inverter 94 as well as the series circuit comprising the delay stages 90, 91 and 92.

The delay stage 90 comprises inverters 95, 99 and 100 as well as NAND gates 96, 97 and 98. The pulse-width control signal PW0 is supplied to one of input terminals of the NAND gate 98. The pulse-width control signal PW0 is also supplied to one of input terminals of the NAND gate 96 by way of the inverter 95. With such a connection, the NAND gate 98 is activated when the pulse-width control signal PW0 is set at a high level but it is the NAND gate 96 that is activated when the pulse-width control signal PW0 is set at a low level. A signal output by the NAND gate 96 propagates to the output terminal OUT by way of the NAND gate 97 at a stage following the NAND gate 96. On the other hand, a signal output by the NAND gate 98 propagates to the output terminal OUT by way of the inverters 99 and 100 as well as the NAND gate 97. In this way, the clock signal propagates to the output terminal OUT by way of the inverters 99 and 100 or by skipping the inverters 99 and 100, switching a delay time from one value to another in dependence on the logic of the pulse-width control signal PW0.

The other delay stages 91 and 92 each have the same configuration as the delay stage 90, being capable of switching a delay time from one value to another in a manner similar to the delay stage 90.

The pulse-width control signals PWRP <O-0> to PWWY <0-t> can be supplied to predetermined input terminals of the SRAM 180. A means for setting the logic of the pulse-width control signals PWRP <O-0> to PWWY <O-t> can have a configuration based on a fuse circuit or a flip-flop circuit outside the SRAM 180. However, the means for setting the logic of the pulse-width control signals PWRP <O-0> to PWWY <O-t> does not have to have such a configuration in particular.

Figure 15:
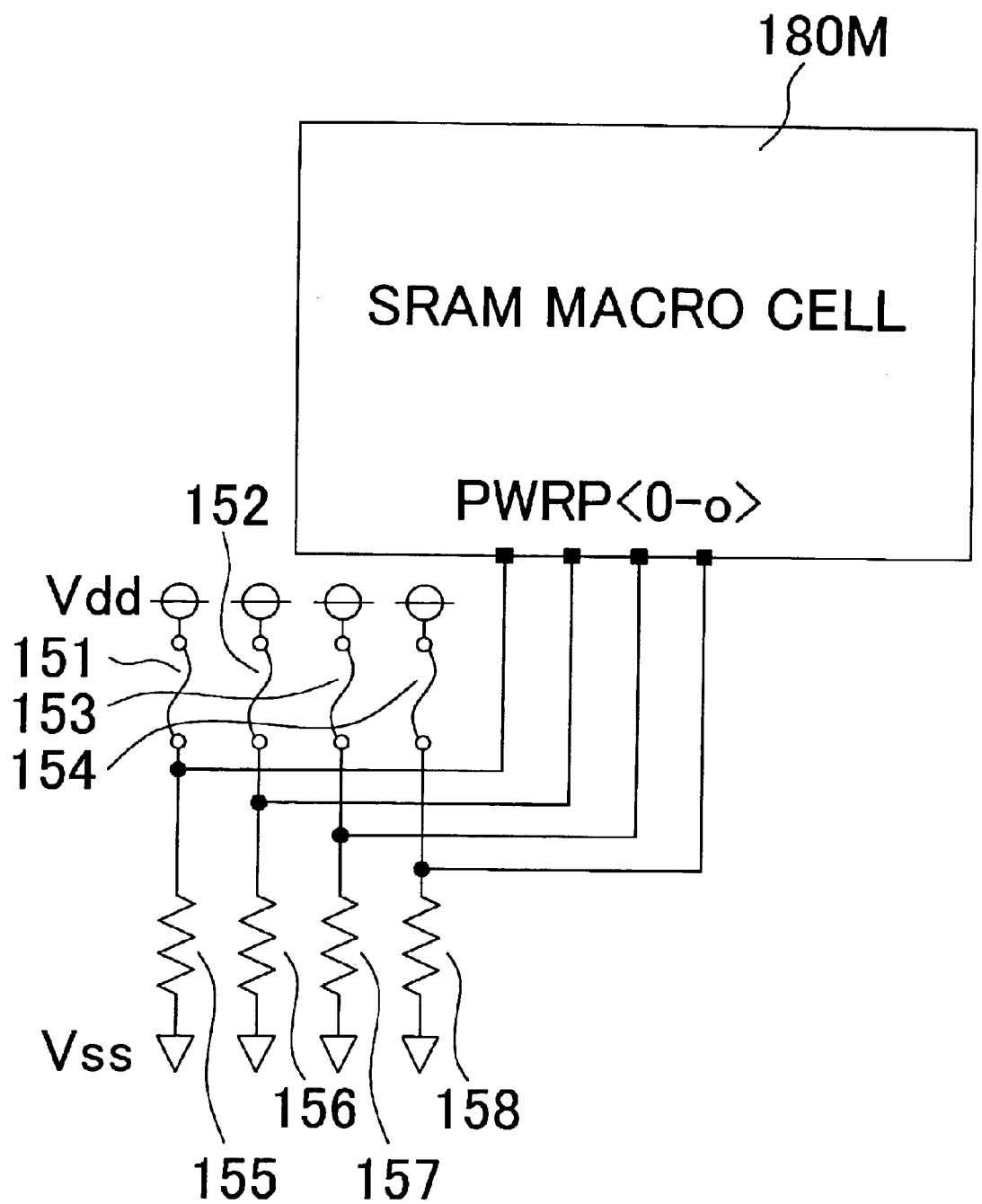
FIG. 15 is a diagram showing a typical circuit configuration of a circuit for setting logic of a pulse-width control signal in the SRAM.
Figure 16:
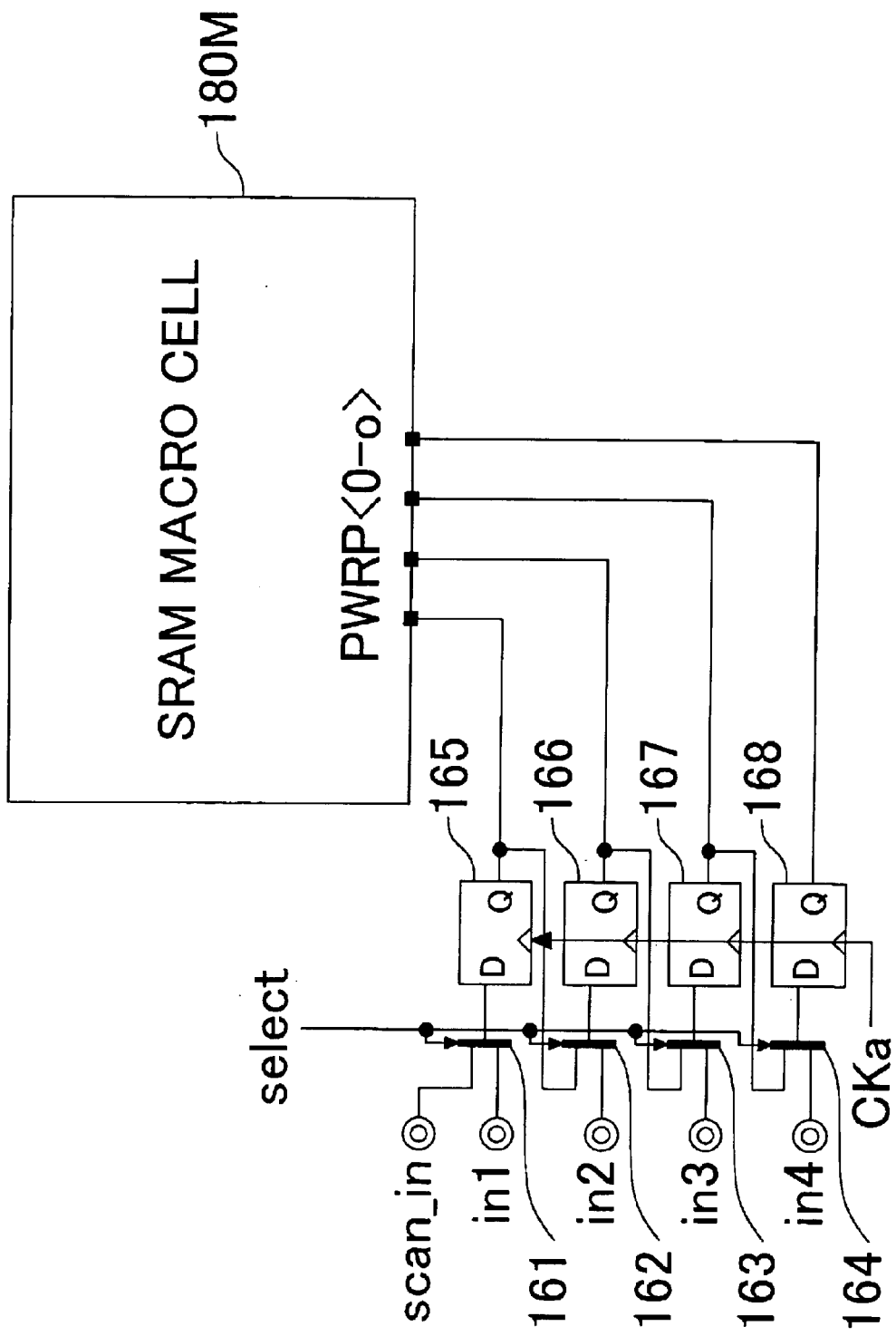
FIG. 16 is a diagram showing another typical circuit configuration of the circuit for setting logic of a pulse-width control signal in the SRAM.
Figure 17:
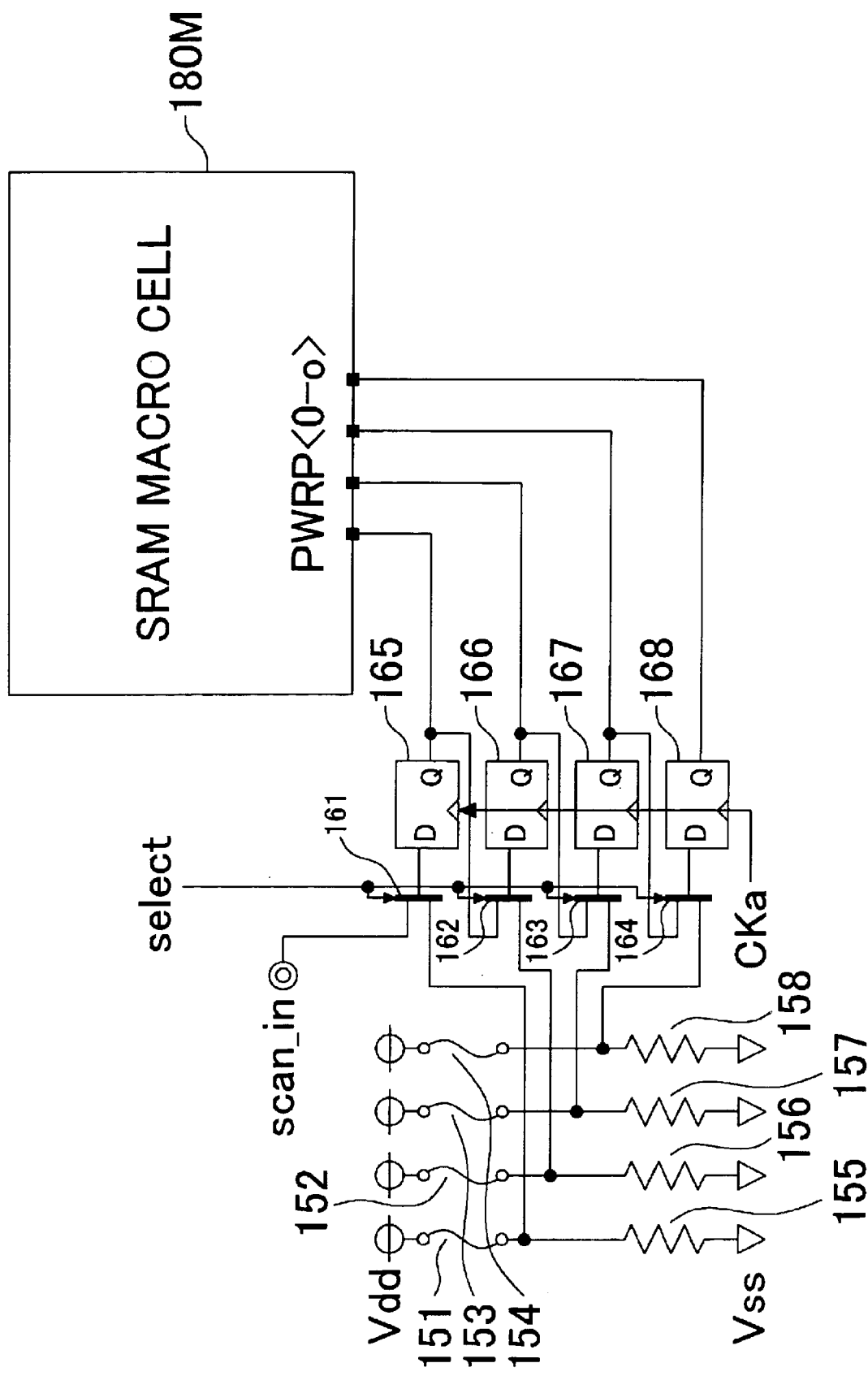
FIG. 17 is a diagram showing a further typical circuit configuration of the circuit for setting logic of a pulse-width control signal in the SRAM.

FIGS. 15 to 17 are each a diagram showing a typical concrete means capable of adjusting the delay time of a delay circuit by setting the logic of the pulse-width control signal PWRP <O-0>. It is to be noted that, in order to make the explanation simple, in FIGS. 15 to 17, the SRAM 180 shown in FIG. 18 is provided as a macrocell 180M. In this case, the pulse-width control signal PWRP <O-0> is a 4-bit signal.

In the typical configuration shown in FIG. 15, the means for setting the logic of the pulse-width control signal PWRP <O-0> is a fuse circuit comprising fuses 151 to 154 and resistors 155 to 158 connected in series to the fuses 151 to 154 respectively. The fuses 151 to 154 are connected to a power supply Vdd on the high electric potential side. On the other hand, the resistors 155 to 158 are connected to a power supply Vss on the low electric potential side. When any specific ones of the fuses 151 to 154 are put in an unbroken state, the series-connection nodes between the specific fuses and the resistors 155 to 158 that are connected to the specific fuses are each set at a high level. The high level is the level of the power supply Vdd on the high electric potential side. If any specific one of the fuses 151 to 154 is broken by using a laser beam or the like, on the other hand, the series-connection node between the specific fuse and one of the resistors 155 to 158 that is connected to the specific fuse is changed from the high level to a low level. The low level is the level of the power supply Vss on the low electric potential side. In this way, the logic of the pulse-width control signal PWRP <O-0> can be set by breaking or not breaking a fuse.

In the typical configuration shown in FIG. 16, the means for setting the logic of the pulse-width control signal PWRP <O-0> comprises switches 161 to 164 and flip-flop circuits 165 to 168. The flip-flop circuits 165 to 168 operate synchronously with a clock signal CKa. The switch 161 selects either a scan-in terminal SCAN_in or an external terminal in1 and connects the selected terminal to a data terminal D of the flip-flop circuit 165. The switch 162 selects either an output terminal Q of the flip-flop circuit 165 or an external terminal in2 and connects the selected terminal to a data terminal D of the flip-flop circuit 166. By the same token, the switch 163 selects either an output terminal Q of the flip-flop circuit 166 or an external terminal in3 and connects the selected terminal to a data terminal D of the flip-flop circuit 167. In the same way, switch 164 selects either an output terminal Q of the flip-flop circuit 167 or an external terminal in4 and connects the selected terminal to a data terminal D of the flip-flop circuit 168.

The operation carried out by each of the switches 161 to 164 to select a terminal as described above is controlled by a selection signal Select. That is to say, the switches 161 to 164 can be controlled by the selection signal Select to select the external terminals in1 to in4 respectively. In this case, the 4 bits of the pulse-width control signal PWRP <O-0> are supplied from the external terminals in1 to in4 to the flip-flop circuits 165 to 168 to be held in the flip-flop circuits 165 to 168 respectively. The values held in the flip-flop circuits 165 to 168 are supplied to the SRAM 180. On the other hand, the selection signal Select can drive the switches 161 to 164 so that the switch 161 selects the scan-in terminal SCAN_in while the switches 162 to 164 select the output terminals Q of the flip-flop circuits 165 to 167 respectively. In this case, a pulse-width control signal serially propagating from the scan-in terminal SCAN_in can be held in the flip-flop circuits 165 to 168 synchronously with the clock signal CKa. In this way, in the configuration shown in FIG. 16, by changing over the switches 161 to 164 from one state to another, either one of 2 different setting modes can be selected.

The typical configuration shown in FIG. 17 is obtained by using the fuse circuit shown in FIG. 15 to determine the logic of the external terminals in1 to in4 shown in FIG. 16.

The circuits described above provide the following operating effects.

(1) The clock generator 185 has delayers 111, 113 and 115 serving as a typical read clock generation circuit for generating a clock signal supplied to peripheral circuits during an operation to read data from the memory-cell array. In addition, the clock generator 185 also has delayers 112, 114 and 116 serving as a typical write clock generation circuit for generating a clock signal supplied to the peripheral circuits during an operation to write data into the memory-cell array. Thus, in an operation to read data from the memory-cell array, the pulse width of a clock signal can be changed independently of an operation to write data into the memory-cell array and, in an operation to write data into the memory-cell array, the pulse width of a clock signal can be changed independently of an operation to read data from the memory-cell array. That is to say, in an operation to read data from the memory-cell array, the pulse width of a clock signal can be adjusted to a value optimum for the read and, in an operation to write data into the memory-cell array, the pulse width of a clock signal can be adjusted to a value optimum for the write. As a result, verification and evaluation can be carried out with ease for each of the read and writes, and results of the verification and the evaluation can be fed back to the design phase for, among other purposes, correction of a layout on the basis of the results.

(2) By using the pulse-width control signals PWRP <O-o>, PWRP <O-p>, PWRP <O-q>, PWRP <O-r>, PWRP <O-s> and PWRP <O-t>, the pulse widths of clock signals supplied to the read-address buffers 11, the read-word decoders/drivers 12, the read-column decoders/drivers 13, the write-address buffers 21, the write-word decoders/drivers 22 and the write-column decoders/drivers 23 can be adjusted individually. Thus, the pulse width of each of the clock signals can be adjusted to a value optimum for the circuit to which the clock signal is supplied. Since the pulse width of each of the clock signals can be adjusted to a value optimum for the circuit to which the clock signal is supplied, verification and evaluation can be carried out with ease for the circuit, and results of the verification and the evaluation can be fed back to the design phase for, among other purposes, correction of a layout on the basis of the results.

(3) Since the pulse widths of clock signals for the read and writes can be changed individually, by optimizing timings, the operation speed can be increased. In the multi-port SRAM, for example, the pulse width of the clock signal for the write is greater than the pulse width of the clock signal for the read. For this reason, the capacity of an internal node in the memory cell can be made large and the write time can be made long. Factors determining the write cycle of the multi-port SRAM include periods TA and TB shown in FIG. 3A. The period TA is a period during which a voltage appearing on the write bit line is equal to or lower than a write threshold value. On the other hand, the period TB is a period during which a voltage appearing on the read bit line is equal to or lower than a read threshold value. While the threshold value for the write may be set at a level not lower than around 80% of a power-supply voltage, the threshold value for the read is set at a level around 90% of the power-supply voltage in many cases such as a high-speed SRAM in particular. In addition, since a sufficient magnitude of the read current needs to be secured, the load of the read bit line increases, causing the precharge time of the read bit line to show a lengthening tendency.

Figure 3A:
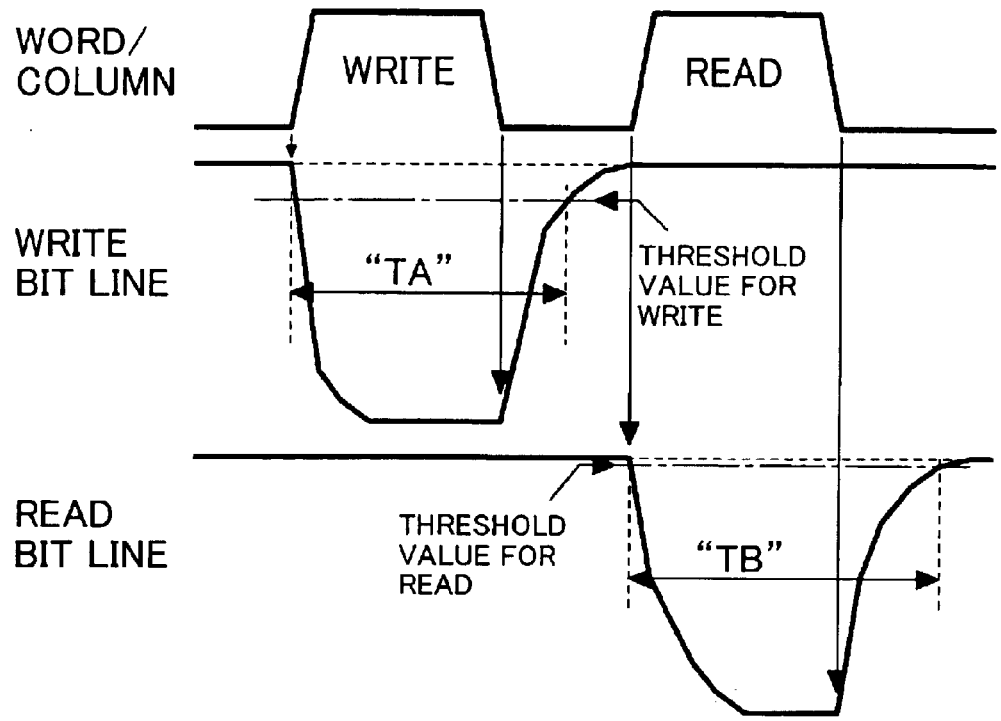
FIG. 3 is an explanatory diagram showing waveforms referred to in describing effects exhibited by the circuit configuration shown in FIG. 1.
Figure 3B:
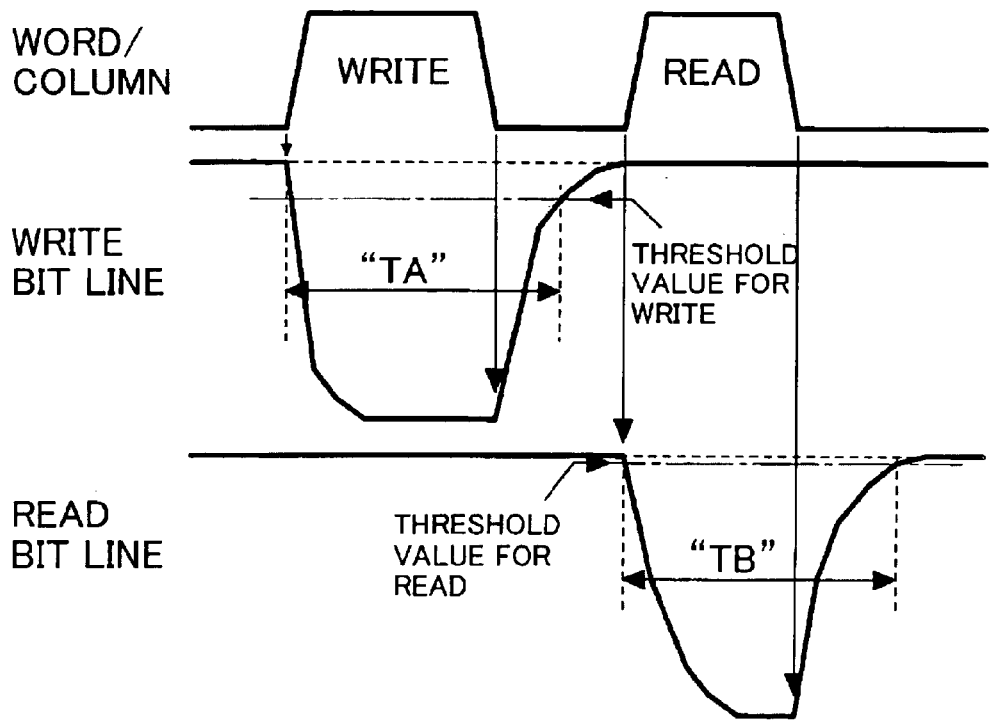

If the pulse width of the clock signal for the read is equal to the pulse width of the clock signal for the write, due to the logical threshold values and the precharge time of the bit line, the TA<TB magnitude relation between the periods TA and TB holds true as shown in FIG. 3A. Thus, the limit of the cycle time is determined by the period TB. By using the configuration shown in FIG. 1 and optimizing the pulse width of the clock signal for the read, it is possible to make the period TB, during which a voltage appearing on the read bit line is equal to or lower than a read threshold value, equal to the period TA as shown in FIG. 3B. Thus, the cycle time can be shortened by the difference (TB−TA) in order to give a higher speed.

(4) By adjusting only the pulse width of the word selection signal, an effective pulse width can be secured. If an incorrect operation has occurred due to a small pulse width of the word selection signal for driving a bit line to a select level as shown in FIG. 6B, for example, only the pulse width of the word selection signal needs to be increased with the pulse width of the column selection signal kept as it is as shown in FIG. 6A. This is because, if the pulse width of the column selection signal is also increased, the increase in pulse width will inevitably cause a decrease in cycle time. In the embodiment described above, the clock generator 185 is capable of adjusting only the pulse widths of the clock signal ckxr for the read word driver and the clock signal ckxw for the write word driver so as to increase only the pulse width of the word selection signal.

(5) By adjusting only the pulse width of the column selection signal, a through current can be avoided. Due to an excessively small pulse width of the column selection signal, for example, there is resulted in a period X during which the word selection signal is set at a high level while the column selection signal is set at a low level as shown in FIG. 6D. In the case of a circuit in which a signal appearing on the word select line drives an n-channel MOS transistor while a signal appearing on the column select line drives a p-channel MOS transistor as shown in FIG. 6C, it is feared that a through current flows along a route 61 in the circuit shown in FIG. 6C when there is a period X during which the word selection signal is set at a high level while the column selection signal is set at a low level as described above. In such a case, by increasing the pulse width of the column selection signal only, the through current described above can be avoided. If the pulse width of the word selection signal is also increased, the through current cannot be avoided. In the embodiment described above, it is possible to adjust only the pulse widths of the clock signal ckyr for the read word driver and the clock signal ckyw for the write word driver so as to avoid the through current.

The following description explains another typical configuration of the SRAM given as a typical semiconductor memory device provided by the present invention.

The embodiment described above implements a multi-port SRAM. However, the same effects can be obtained from a single-port memory device in which a port is used for both inputting and outputting data.

Figure 2:
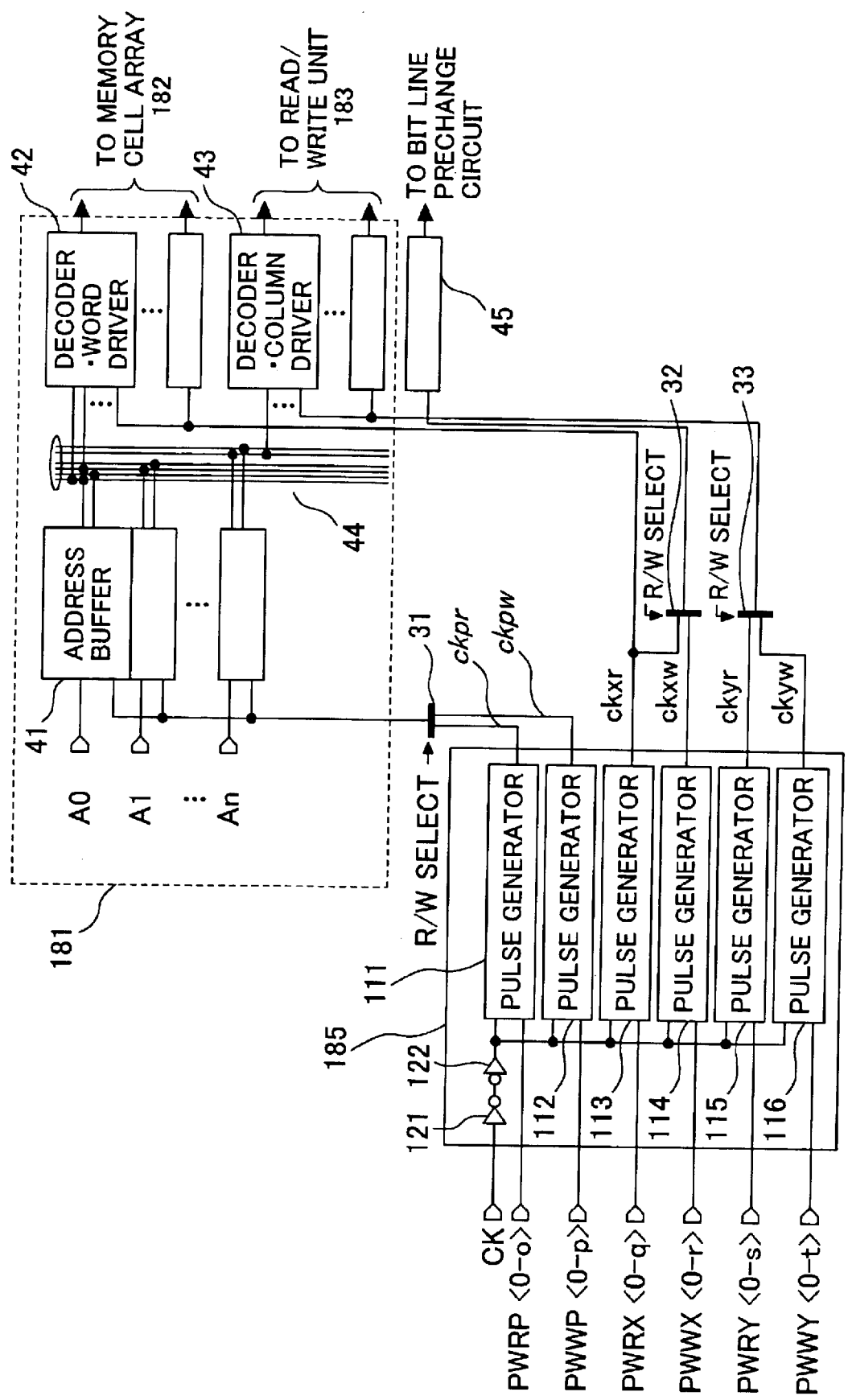
FIG. 2 is a block diagram showing another typical circuit configuration comprising main components employed in the SRAM.

FIG. 2 is a diagram showing typical configurations of a decode unit 181 and a clock generator 185 for a single-port memory device.

The decode unit 181 shown in FIG. 2 includes a plurality of address buffers 41, a plurality of word decoders/drivers 42, a plurality of column decoders/drivers 43 and decode lines 44. The address buffers 41, the word decoders/drivers 42, the column decoders/drivers 43 and the decode lines 44 are used for both read and write operations.

The address buffers 41 are used for storing address signals A0 to An, which are received from an external source, synchronously with a clock signal provided by way of a selector 31 as will be described later. Signals output by the address buffers 41 are supplied to the word decoders/drivers 42 and the column decoders/drivers 43 through the decode lines 44. The word decoders/drivers 42 include a word decoder for decoding the signals received from the decode lines 44 and a word driver for driving a word line to a select level on the basis of a decoding result generated by the word decoder. The word driver drives a word line to the select level synchronously with a clock signal ckxr provided for the word driver used in a read operation. The column decoders/drivers 43 include a read decoder for decoding the signals received from the decode lines 44 and a column driver for driving a column select circuit, which is employed in the read/write unit 183, on the basis of a decoding result generated by the read decoder. The read column driver drives the read column select circuit synchronously with a clock signal provided by way of a selector 33 as will be described later.

It is to be noted that there is also provided a bit-line precharge driver 45 for driving a bit-line precharge circuit for precharging a bit line. The bit-line precharge driver 45 drives the bit-line precharge circuit synchronously with a clock signal provided by way of a selector 32 as will be described later.

The clock generator 185 has the same configuration as that shown in FIG. 1 except that the clock generator 185 shown in FIG. 2 includes the selectors 31, 32 and 33 each used for selecting one of input clock signals on the basis of a read/write selection signal R/W Select due to the fact that the decode unit 181 is used for both read and write operations.

To be more specific, the selector 31 selects either a clock signal ckpr generated by the pulse generator 111 as a clock signal for the address buffers 41 used in a read cycle or a clock signal ckpw generated by the pulse generator 112 as a clock signal for the address buffers 41 used in a write cycle, and then supplies the selected clock signal to the address buffers 41. To put it in detail, in a read cycle, the read/write selection signal R/W Select is set at a high level driving the selector 31 to select the clock signal ckpr generated by the pulse generator 111 and then supply the selected clock signal ckpr to the address buffers 41. In a write cycle, on the other hand, the read/write selection signal R/W Select is set at a low level driving the selector 31 to select the clock signal ckpw generated by the pulse generator 112 and then supply the selected clock signal ckpw to the address buffers 41.

The selector 32 selects either a clock signal ckxr generated by the pulse generator 113 as a clock signal for the bit-line precharge driver 45 used in a read cycle or a clock signal ckxw generated by the pulse generator 114 as a clock signal for the bit-line precharge driver 45 used in a write cycle, and then supplies the selected clock signal to the bit-line precharge driver 45. To put it in detail, in a read cycle, the read/write selection signal R/W Select is set at a high level driving the selector 32 to select the clock signal ckxr generated by the pulse generator 113 and then supply the selected clock signal ckxr to the bit-line precharge driver 45. In a write cycle, on the other hand, the read/write selection signal R/W Select is set at a low level driving the selector 32 to select the clock signal ckxw generated by the pulse generator 114 and then supply the selected clock signal ckxw to the bit-line precharge driver 45.

The selector 33 selects either a clock signal ckyr generated by the pulse generator 115 as a clock signal for the column decoders/drivers 43 used in a read cycle or a clock signal ckyw generated by the pulse generator 116 as a clock signal for the column decoders/drivers 43 used in a write cycle, and then supplies the selected clock signal to the column decoders/drivers 43. To put it in detail, in a read cycle, the read/write selection signal R/W Select is set at a high level driving the selector 33 to select the clock signal ckyr generated by the pulse generator 115 and then supply the selected clock signal ckyr to the column decoders/drivers 43. In a write cycle, on the other hand, the read/write selection signal R/W Select is set at a low level driving the selector 33 to select the clock signal ckyw generated by the pulse generator 116 and then supply the selected clock signal ckyw to the column decoders/drivers 43.

In spite of the fact that the configurations shown in FIG. 2 are configurations for a single-port memory device in which the decode unit 181 and the bit-line precharge driver 45 are used for both read and write cycles, the same effects as those exhibited by the configurations shown in FIG. 1 can be obtained. This is because the configurations shown in FIG. 2 include the selectors 31, 32 and 33 driven by the read/write selection signal R/W Select to select proper clock signals generated by the clock generator 185 and supply the selected clock signal to the decode unit 181 and the bit-line precharge driver 45.

In addition, even in the case of the single-port memory device, the pulse width of a clock signal for the read can be adjusted independently of a clock signal for the write. Thus, timings can be optimized to increase the operation speed.

Figure 4A:
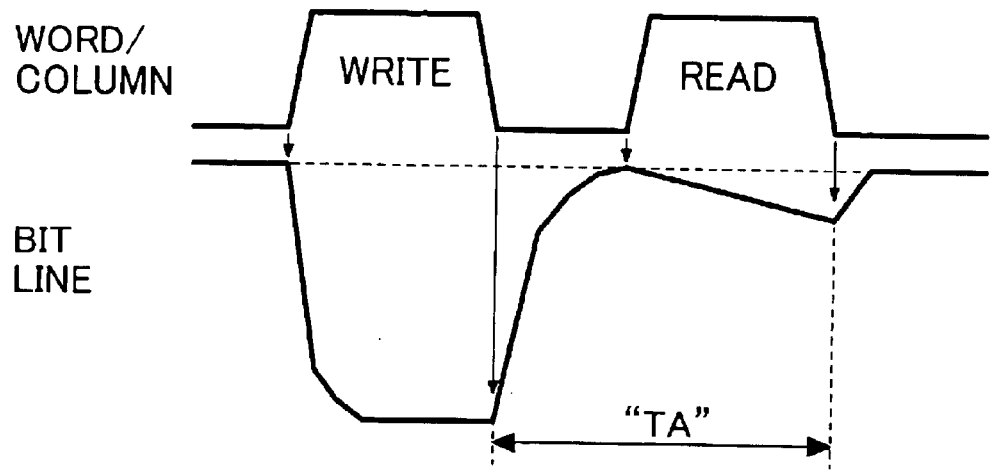
FIG. 4 is an explanatory diagram showing waveforms referred to in describing effects exhibited by the circuit configuration shown in FIG. 2.
Figure 4B:
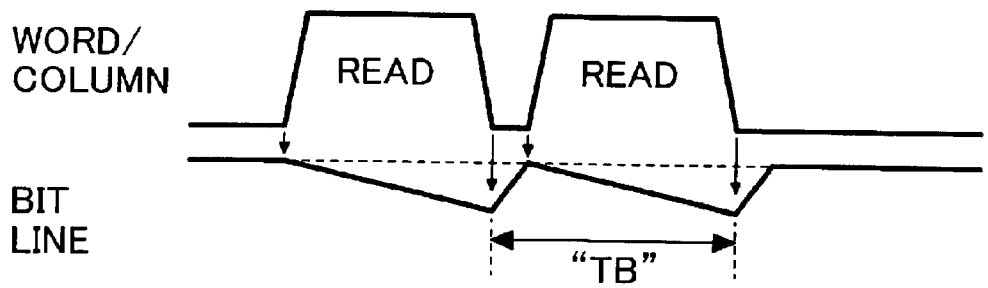
Figure 4C:
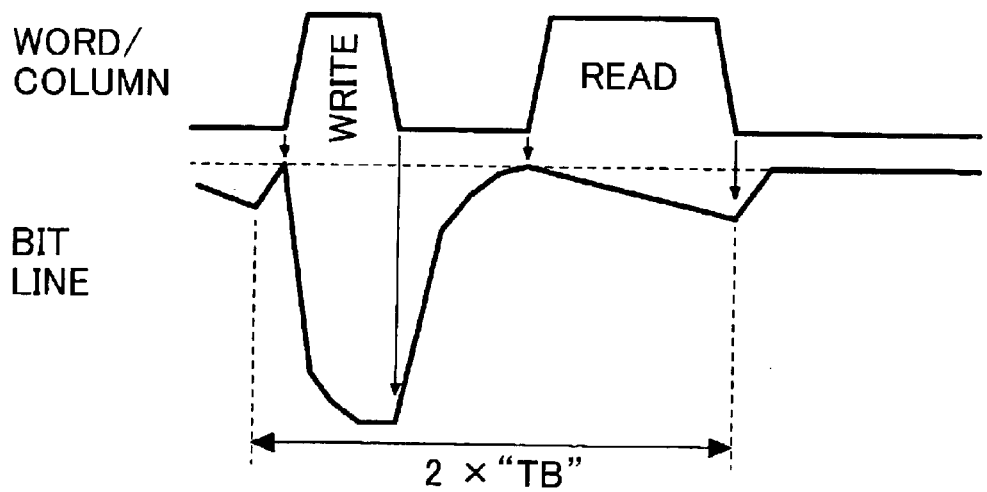

In a single-port memory device, particularly, in a small-amplitude operation thereof, the pulse-width of a control signal in a read cycle is greater than the pulse-width of a control signal in a write cycle, the capacitance of a node in a memory cell is relatively small and the write time is thus shorter. Factors determining the cycle time can be divided into 2 cases. One of the cases is shown in FIG. 4A showing a write-after-read case, in which a write cycle follows a read cycle. The other case is shown in FIG. 4B showing a read-after-read case, in which a read cycle follows a read cycle. If the pulse-width of a clock signal in a read cycle is equal to the pulse-width of a clock signal in a write cycle, the limit of the cycle time is determined by the write-after-read case shown in FIG. 4A. If the pulse widths of a column selection signal and a signal for driving a word line in a write cycle are each optimized to a smaller value as shown in FIG. 4C, however, a high-speed cycle operation can be carried out till a minimum cycle time determined by a read-after-read case is reached.

FIG. 5 is a diagram showing a typical configuration of the decode unit 181 employed in an SRAM having clock signals generated for 2 ports in a read cycle and 2 ports in a write cycle. FIG. 23 is a diagram showing a detailed typical configuration of a clock generator 185 shown in FIG. 5.

The circuit configuration shown in FIG. 5 is much different from that shown in FIG. 1 in that, the circuit configuration shown in FIG. 5 has 2 ports, namely A and B ports, for read cycles and 2 other ports, namely A and B ports, for write cycles. As shown in FIG. 23, the clock generator 185 has more pulse generators for the more ports described above.

To put it in detail, the decode unit 181 includes a read-use decoder 10 used in read cycles and a write-use decoder 20 used in write cycles. The read-use decoder 10 has an A-port read-use decoder 10A and a B-port read-use decoder 10B whereas the write-use decoder 20 has an A-port write-use decoder 20A and a B-port write-use decoder 20B.

The A-port read-use decoder 10A and the B-port read-use decoder 10B are distinguished from each other by using suffixes A and B but, basically, they have the same configuration as the read-use decoder 10 shown in FIG. 1.

By the same token, the A-port write-use decoder 20A and the B-port write-use decoder 20B are distinguished from each other by using suffixes A and B but, basically, they have the same configuration as the write-use decoder 20 shown in FIG. 1.

The clock generator 185 shown in FIG. 5 has A-port pulse generators 111A, 112A, 113A, 114A, 115A and 116A as well as B-port pulse generators 111B, 112B, 113B, 114B, 115B and 116B. The A-port pulse generators 11A, 112A, 113A, 114A, 115A and 116A are distinguished from the B-port pulse generators 111B, 112B, 113B, 114B, 115B and 116B respectively by using suffixes A and B but, basically, they have the same configuration as the pulse generators 111, 112, 113, 114, 115 and 116 shown in FIG. 21. By using the pulse-width control signals PWRPA <O-o>, PWRPB <O-p>, PWRXA <O-q>, PWRXB <O-r>, PWRYA <O-s>, PWRYB <O-t>, PWRYB <O-u>, PWRYB <O-v>, PWRYB <O-w>, PWRYB <O-x>, PWRYB <O-y> and PWRYB <O-z>, the pulse widths of clock signals generated by the A-port pulse generators 11A, 112A, 113A, 114A, 115A and 116A as well as the B-port pulse generators 111B, 112B, 113B, 114B, 115B and 116B can be adjusted.

Even in the case of an SRAM in which clock signals are generated for read and write cycles and for 2 ports as described above, it is possible to obtain the same effects as those exhibited by the embodiments described earlier. This is because not only are the clock signals generated separately for the A and B ports in read cycles as well as the A and B ports in write cycles, but each of the clock signals is generated for every internal configuration block unit so that the pulse width of each individual clock signal can be controlled.

It is to be noted that, even in the case of an SRAM in which clock signals are generated for read and write cycles and for 2 ports as described above, it is possible to obtain the same effects as those exhibited by the embodiments described earlier by using a configuration shown in FIG. 5 for the A and B ports in read cycles as well-as the A and B ports in write cycles.

Figure 7:
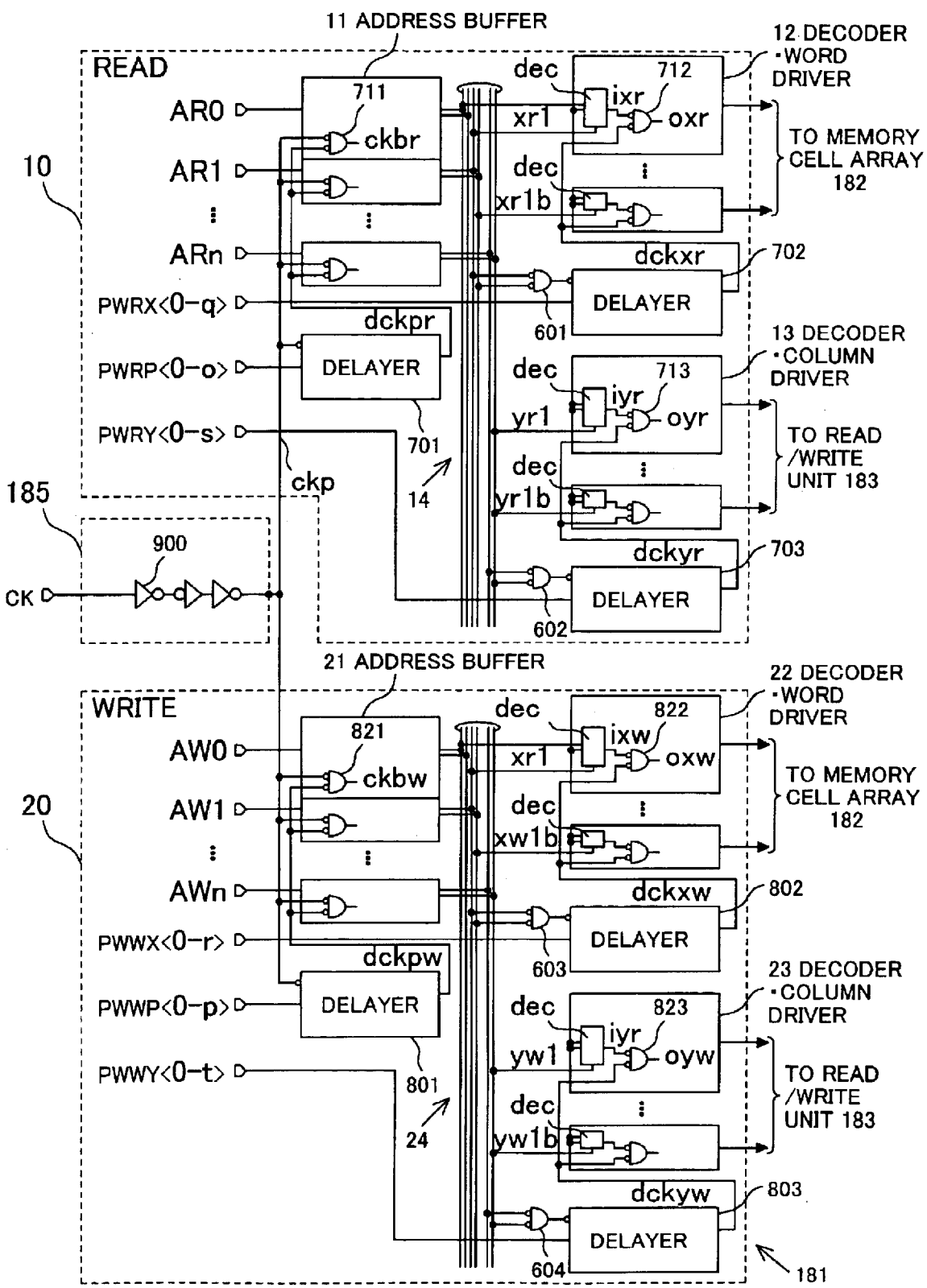
FIG. 7 is a block diagram showing a further typical circuit configuration comprising the main components employed in the SRAM.
Figure 10:
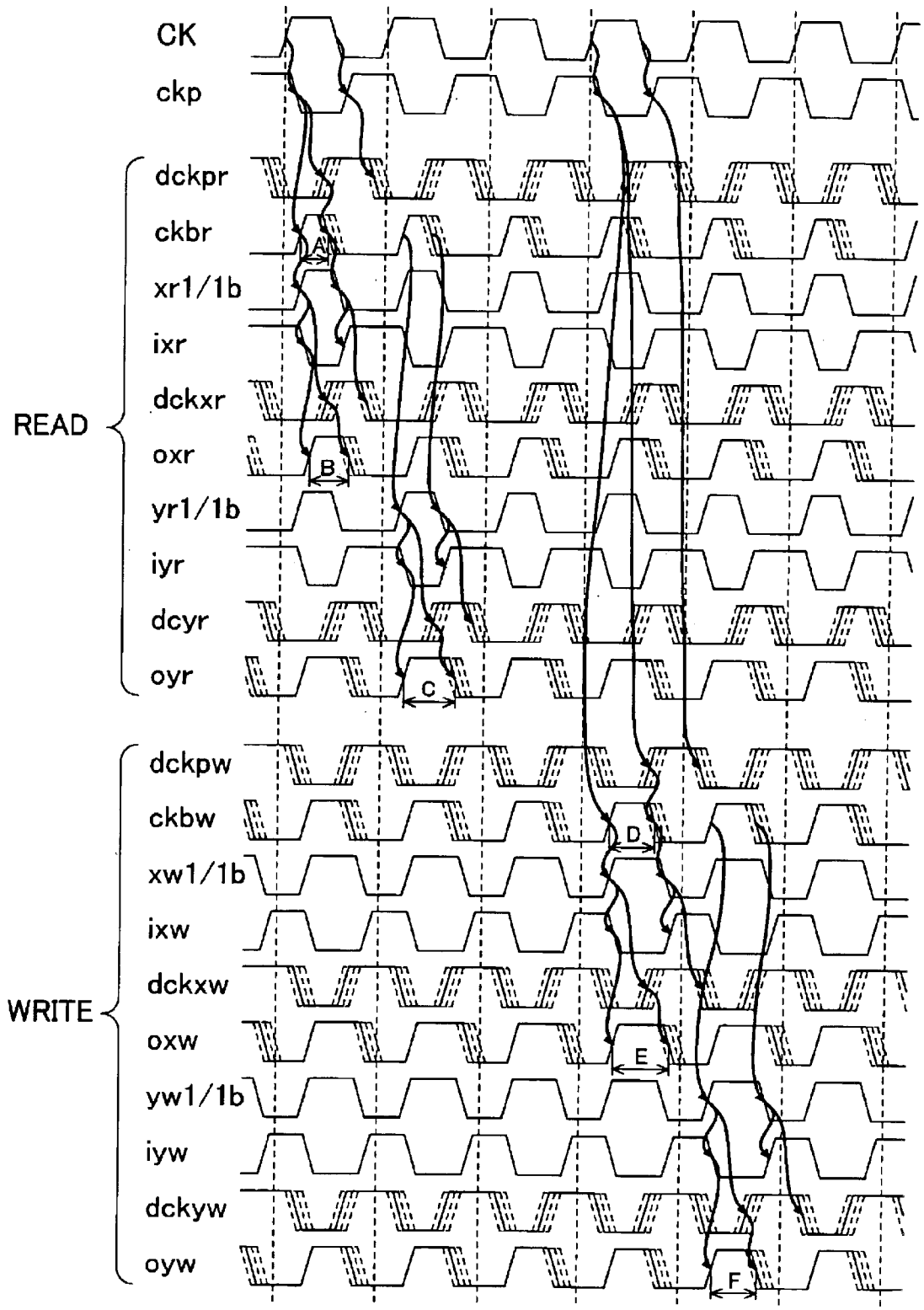
FIG. 10 is an operation timing diagram of the main components employed in the SRAM.

FIG. 7 is a diagram showing another typical configuration of the decode unit 181. FIG. 10 is a diagram showing operation timings of main components shown in FIG. 7.

The clock generator 185 shown in FIG. 7 comprises an inverter row 900. On the other hand, the decode unit 181 comprises delayers 701, 702, 703, 801, 802 and 803 as well as gate circuits 711, 712, 713, 821, 822 and 823. The delayers 701, 702, 703, 801, 802 and 803 can adopt any one of the circuit configurations shown in FIGS. 12 to 14 much like the delayers employed in the typical configurations explained earlier. However, the circuit configuration of the delayers 701, 702, 703, 801, 802 and 803 does not have to be one of the circuit configurations shown in FIGS. 12 to 14. The inverter row 900 is an array of 3 inverters connected to each other in series. However, the configuration of the inverter row 900 is not limited to this series circuit. A clock signal is supplied to an input terminal of the inverter row 900. A clock signal ckp output from an output terminal of the inverter row 900 is supplied to the delayers 701 and 801 as well as the gate circuits 711 and 821.

The delayer 701 delays the clock signal ckp received from the inverter row 900, generating a clock signal dckpr for a plurality of read address buffers 11. Provided for each of the read address buffers 11, the gate circuit 711 generates a clock signal ckbr representing NOR logic of the clock signal ckp output by the inverter row 900 and the clock signal dckpr output by the delayer 701 for the read address buffers 11. The read address buffers 11 are used for storing address signals AR0 to ARn synchronously with the clock signal ckbr output by the gate circuit 711. The pulse width of the clock signal ckbr output by the gate circuit 711 is determined by the delay time of the delayer 701. The delay time of the delayer 701 can be switched from one value to another by using a pulse-width control signal PWRP <O-o>. Thus, the pulse width of the clock signal ckbr can be adjusted by using the pulse-width control signal PWRP <O-o>.

The delayer 702 delays a signal output by a gate circuit 601, generating a clock signal dckxr for a plurality of read-word decoders/drivers 12. The signal output by the gate circuit 601 is a signal representing NOR logic of signals appearing on predetermined signal lines of the decode lines 14. Provided for each of the read-word decoders/drivers 12, the gate circuit 712 generates a signal oxr representing NOR logic of a signal ixr output by a decoder dec employed in the read-word decoders/driver 12 and the clock signal dckxr output by the delayer 702 for the read-word decoders/driver 12. A word line is selected on the basis of the signal oxr output by the gate circuit 712. The pulse width of the signal oxr output by the gate circuit 712 is determined by the delay time of the delayer 702. The delay time of the delayer 702 can be switched from one value to another by using a pulse-width control signal PWRX <O-q>. Thus, the pulse width of the signal oxr can be adjusted by using the pulse-width control signal PWRX <O-q>.

The delayer 703 delays a signal output by a gate circuit 602, generating a clock signal dckyr for a plurality of read-column decoders/drivers 13. The signal output by the gate circuit 602 is a signal representing NOR logic of signals appearing on predetermined signal lines of the decode lines 14. Provided for each of the read-column decoders/drivers 13, the gate circuit 713 generates a signal oyr representing NOR logic of a signal iyr output by a decoder employed in the read-column decoders/driver 13 and the clock signal dckyr output by the delayer 703 for the read-column decoders/driver 13. A column of the read is selected on the basis of the signal oyr output by the gate circuit 713. The pulse width of the signal oyr output by the gate circuit 713 is determined by the delay time of the delayer 703. The delay time of the delayer 703 can be switched from one value to another by using a pulse-width control signal PWRY <O-s>.

Thus, the pulse width of the signal oyr can be adjusted by using the pulse-width control signal PWRY <O-s>.

The delayer 801 delays the clock signal ckp output by the inverter row 900, generating a clock signal dckpw for a plurality of write address buffers 21. Provided for each of the write address buffers 21, the gate circuit 821 generates a clock signal ckbw representing NOR logic of the clock signal ckp output by the inverter row 900 and the clock signal dckpw output by the delayer 801 for the write address buffers 21. The write address buffers 21 are used for storing address signals AW0 to AWn synchronously with the clock signal ckbw output by the gate circuit 821. The pulse width of the clock signal ckbw output by the gate circuit 821 is determined by the delay time of the delayer 801. The delay time of the delayer 801 can be switched from one value to another by using a pulse-width control signal PWWP <O-p>. Thus, the pulse width of the clock signal ckbw can be adjusted by using the pulse-width control signal PWWP <O-p>.

The delayer 802 delays a signal output by a gate circuit 603, generating a clock signal dckxw for a plurality of write-word decoders/drivers 22. The signal output by the gate circuit 603 is a signal representing NOR logic of signals appearing on predetermined signal lines of the decode lines 24. Provided for each of the write-word decoders/drivers 22, the gate circuit 822 generates a signal oxw representing NOR logic of a signal ixw output by a decoder dec employed in the write-word decoders/driver 22 and the clock signal dckxw output by the delayer 802 for the write-word decoders/driver 22. A word line is selected on the basis of the signal oxw output by the gate circuit 822. The pulse width of the signal oxw output by the gate circuit 822 is determined by the delay time of the delayer 802. The delay time of the delayer 802 can be switched from one value to another by using a pulse-width control signal PWWX <O-r>. Thus, the pulse width of the signal oxw can be adjusted by using the pulse-width control signal PWWX <O-r>.

The delayer 803 delays a signal output by a gate circuit 604, generating a clock signal dckyw for a plurality of write-column decoders/drivers 23. The signal output by the gate circuit 604 is a signal representing NOR logic of signals appearing on predetermined signal lines of the decode lines 24. Provided for each of the write-column decoders/drivers 23, the gate circuit 823 generates a signal oyw representing NOR logic of a signal iyw output by a decoder employed in the write-column decoders/driver 23 and the clock signal dckyw output by the delayer 803 for the write-column decoders/driver 23. A column of the write is selected on the basis of the signal oyw output by the gate circuit 823. The pulse width of the signal oyw output by the gate circuit 823 is determined by the delay time of the delayer 803. The delay time of the delayer 803 can be switched from one value to another by using a pulse-width control signal PWWY <O-t>. Thus, the pulse width of the signal oyw can be adjusted by using the pulse-width control signal PWWY <O-t>.

In the configuration described above, as indicated by boxes hatched with dashed lines shown in FIG. 10, the pulse widths of each clock signal and a signal generated on the basis of the clock signal for the read can of course be individually adjusted in a manner independent of signals for the write and vice versa, and the pulse widths of each clock signal and a signal generated on the basis of the clock signal can be adjusted independently for the delayers 701, 702, 703, 801, 802 and 803. In the examples shown in FIG. 10, the pulse width of the clock signal ckbr output by the gate circuit 711 is adjusted to a magnitude A, the pulse width of the signal oxr output by the gate circuit 712 is adjusted to a magnitude B, the pulse width of the signal oyr output by the gate circuit 713 is adjusted to a magnitude C, the pulse width of the clock signal ckbw is adjusted to a magnitude D, the pulse width of the signal oxw output by the gate circuit 821 is adjusted to a magnitude E and the pulse width of the signal oyw output by the gate circuit 823 is adjusted to a magnitude F.

Figure 8:
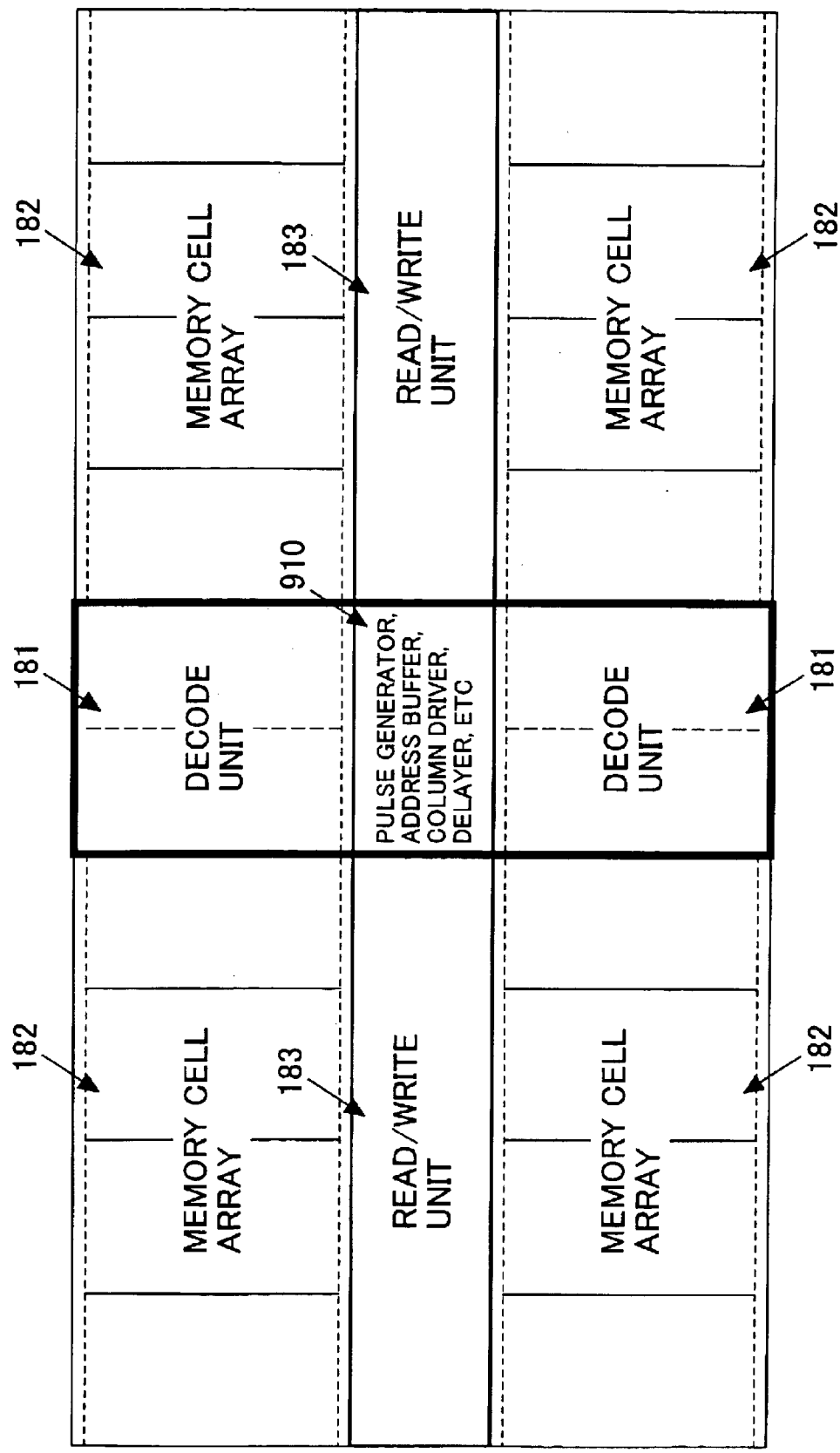
FIG. 8 is an explanatory diagram showing a layout of the main components employed in the SRAM.

FIG. 8 is a diagram showing the top view of a layout of a chip adopting the configuration shown in FIG. 7. The layout includes 4 areas of the memory-cell array 182. At the center of the chip, the decode unit 181 is placed, being oriented in the vertical direction, and the read/write unit 183 is placed, being oriented in the horizontal direction. At the intersection of the decode unit 181 and the read/write unit 183, there is provided an area 910 in which components such as pulse generators, address buffers, column drivers and delayers are created.

Figure 9:
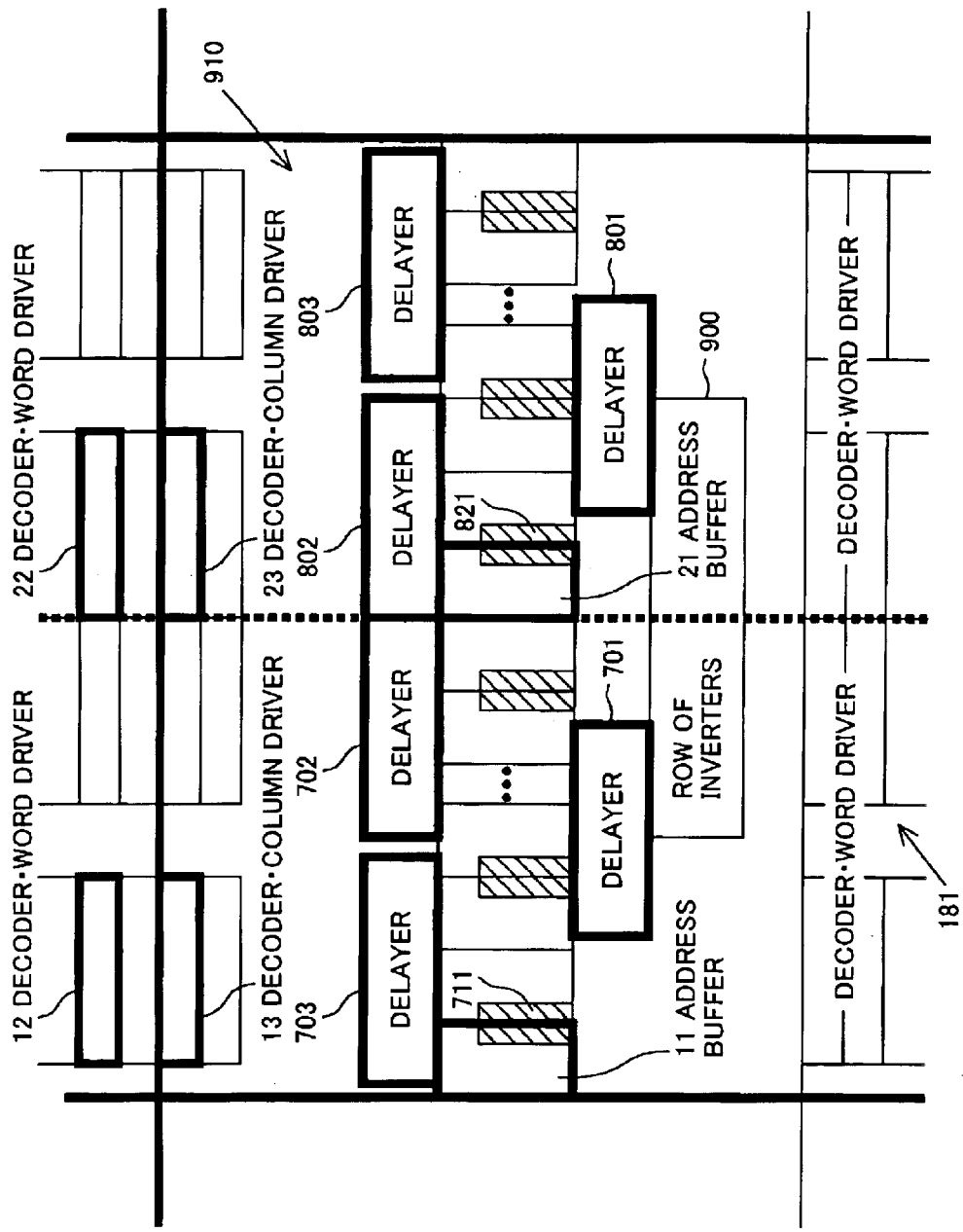
FIG. 9 is an explanatory diagram showing a layout of the main components employed in the SRAM.

FIG. 9 is a diagram showing an enlarged area 910 in which components such as pulse generators, address buffers, column drivers and delayers are created. At the center of the area 910, a plurality of address buffers 11 and 21 is placed, being oriented in the horizontal direction, and gate circuits 711 and 821 associated with the address buffers 11 and 21 are provided, being spread at several locations. The delayers 702, 703, 802 and 803 are placed at certain locations on one side of the address buffers 11 and 21 whereas the delayers 701 and 801 are placed at other locations on the other side of the address buffers 11 and 21 in such a way that the certain locations and the other locations sandwich the address buffers 11 and 21. The inverter row 900 is located at a position in close proximity to the delayers 701 and 801.

Figure 11:
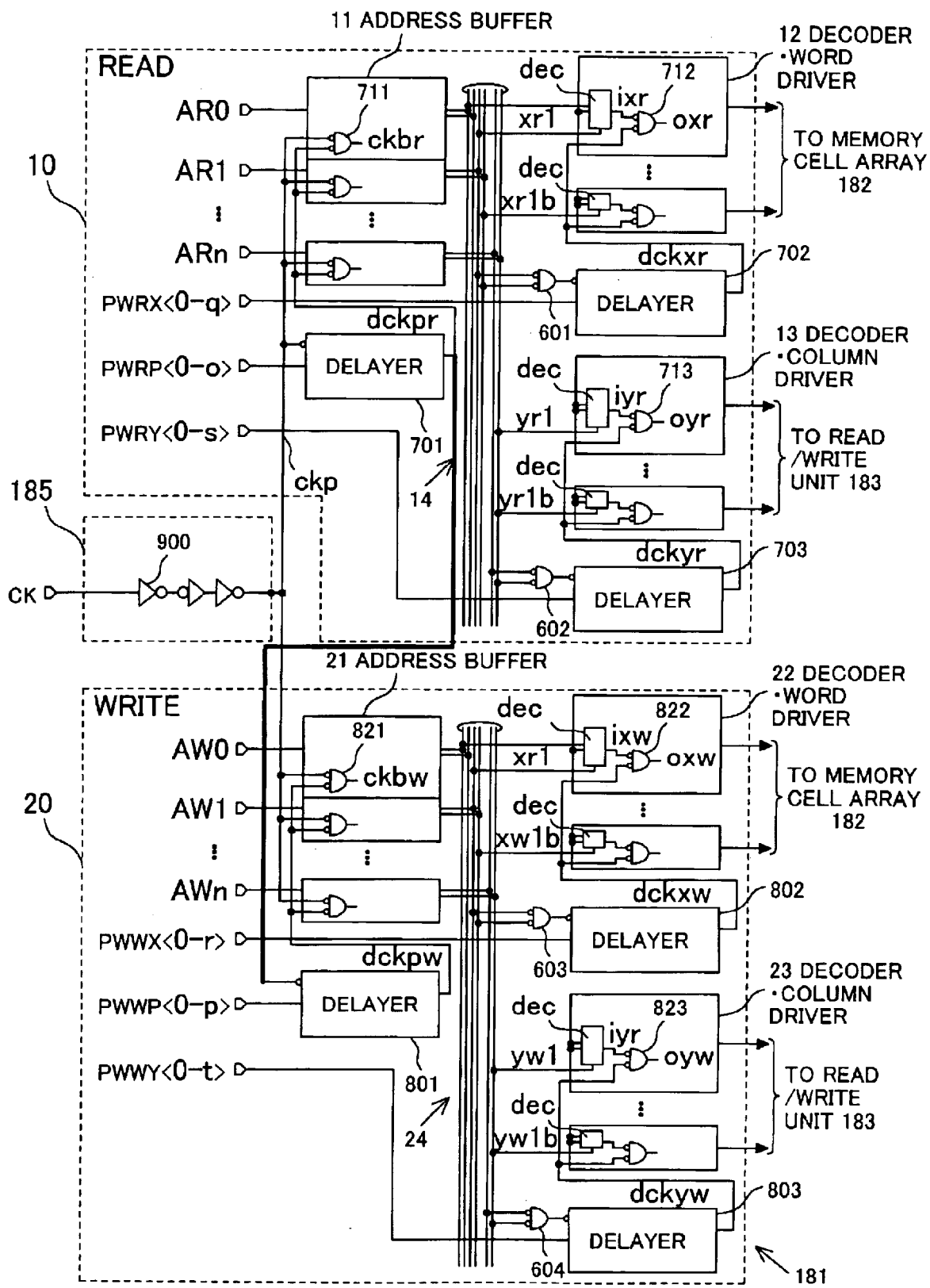
FIG. 11 is a block diagram showing a still further typical circuit configuration comprising the main components employed in the SRAM.

FIG. 11 is a diagram showing another typical configuration of the decode unit 181. The clock generator 185 shown in FIG. 11 is different from that shown in FIG. 7 in that, in the case of the clock generator 185 shown in FIG. 11, clock signals for address buffers of the write are generated on the basis of clock signals for address buffers of the read. To put it concretely, the delayer 801 inputs and delays the clock signal dckpr output by the delayer 701 in order to generate a clock signal dckpw. Since the clock signal dckpr itself is a delayed signal, the delay time of the delayer 801 can be made short. Thus, the circuit scale of the delayer 801 can be shrunk.

The invention discovered by the inventor has been explained concretely. However, the scope of the present invention is not limited to what has been described so far. That is to say, a variety of changes within a range not deviating from essentials of the present invention can of course, be made to what has been described above.

The above descriptions explain mainly a case in which the invention discovered by the inventor is applied to a particular SRAM in a field of applications serving as the background of the invention. However, the scope of the present invention is not limited to the particular SRAM. Instead, the present invention can be applied to a broad application range covering a variety of semiconductor memory devices.

The present invention can be applied to any semiconductor memory device provided that the semiconductor memory device includes a memory-cell array comprising at least a plurality of memory cells.

The following description briefly explains effects exhibited by representatives of the present invention, which are disclosed in this specification.

Since the pulse widths of clock signals generated for the read can be individually adjusted in a manner independent of clock signals generated for the write and vice versa, the clock signals can be set at pulse widths optimum for the read and writes. As a result, verification and evaluation can be carried out with ease for each of the read and writes, and results of the verification and the evaluation can be fed back to the design phase for, among other purposes, correction of a layout on the basis of the results.

What is claimed is:

1. A semiconductor memory device comprising:
   a memory-cell array comprising a plurality of memory cells laid out therein as memory cells each capable of storing data;
   a read circuit used in a data read operation to read out data from said memory-cell array;
   a write circuit used in a data write operation to write data into said memory-cell array;
   a read clock generation circuit for generating a read clock signal to be supplied to said read circuit in said data read operation to read out data from said memory-cell array;
   a write clock generation circuit for generating a write clock signal to be supplied to said write circuit in said data write operation to write data into said memory-cell array;
   a read pulse-width adjustment circuit provided in said read clock generation circuit for adjusting the pulse width of said read clock signal generated by said read clock generation circuit; and
   a write pulse-width adjustment circuit provided in said write clock generation circuit for adjusting the pulse width of said write clock signal generated by said write clock generation circuit, wherein said pulse width of said read clock signal and said pulse width of said write clock signal are adjusted individually.

2. A semiconductor memory device according to claim 1 wherein:
   said read circuit or said write circuit has a plurality of ports with any one of said ports allowing data to be read out from said memory-cell array or written into said memory-cell array in a manner independent of the other ports; and
   said read pulse-width adjustment circuit or said write pulse-width adjustment circuit is provided for each of said ports.

3. A semiconductor memory device according to claim 1 wherein:
   said read pulse-width adjustment circuit and said write pulse-width adjustment circuit each have a delay circuit and a delay adjustment circuit for adjusting a signal delay of said delay circuit; and
   said delay adjustment circuit includes a fuse circuit for determining a state of a control signal for adjusting said signal delay of said delay circuit.

4. A semiconductor memory device according to claim 1 wherein:
   said read pulse-width adjustment circuit and said write pulse-width adjustment circuit each have a delay circuit and a delay adjustment circuit for adjusting a signal delay of a delay circuit; and
   said delay adjustment circuit includes a flip-flop circuit for determining a state of a control signal for adjusting said signal delay of said delay circuit.

5. A semiconductor memory device comprising:
   a memory-cell array comprising a plurality of memory cells laid out therein as memory cells each capable of storing data;
   a read circuit used in a data read operation to read out data from said memory-cell array;
   a write circuit used in a data write operation to write data into said memory-cell array;
   a read clock generation circuit for generating a read clock signal to be supplied to said read circuit in said data read operation to read out data from said memory-cell array;
   a write clock generation circuit for generating a write clock signal to be supplied to said write circuit in said data write operation to write data into said memory-cell array;
   a read pulse-width adjustment circuit provided in said read clock generation circuit as a circuit for adjusting the pulse width of said read clock signal generated by said read clock generation circuit; and
   a write pulse-width adjustment circuit provided in said write clock generation circuit as a circuit for adjusting the pulse width of said write clock signal generated by said write clock generation circuit; wherein:
   said pulse width of said read clock signal and said pulse width of said write clock signal are adjusted individually;
   said read pulse-width adjustment circuit provided in said read clock generation circuit has a delay circuit for delaying an input signal and a logic gate for forming a waveform on the basis of a signal output by said delay circuit; and
   a plurality of said logic gates is provided at locations spread in said read circuit.

6. A semiconductor memory device according to claim 5 wherein:
   said read circuit includes:
      an address buffer for storing an address signal;
      a row-system decode circuit for generating a selection signal, which is used for selecting a row system, on the basis of said address signal stored in said address buffer; and
      a column-system decode circuit for generating a selection signal, which is used for selecting a column system, on the basis of said address signal stored in said address buffer;
   one of said logic gates is provided for said row-system decode circuit included in said read circuit; and
   another one of said logic gates is provided for said column-system decode circuit included in said read circuit.

7. A semiconductor memory device according to claim 6 wherein:
   said logic gate provided for said row-system decode circuit outputs a signal representing computed logic of a signal generated by said row-system decode circuit and a signal generated by said delay circuit; and
   said logic gate provided for said column-system decode circuit outputs a signal representing computed logic of a signal generated by said column-system decode circuit and a signal generated by said delay circuit.

8. A semiconductor memory device according to claim 5 wherein:
   said read pulse-width adjustment circuit and said write pulse-width adjustment circuit each have a delay circuit and a delay adjustment circuit for adjusting a signal delay of said delay circuit; and
   said delay adjustment circuit includes a fuse circuit for determining a state of a control signal for adjusting said signal delay of said delay circuit.

9. A semiconductor memory device according to claim 5 wherein:

said read pulse-width adjustment circuit and said write pulse-width adjustment circuit a delay circuit and a delay adjustment circuit for adjusting a signal delay of said delay circuit; and said delay adjustment circuit includes a flip-flop circuit for determining a state of a control signal for adjusting said signal delay of said delay circuit.

10. A semiconductor memory device comprising:

a memory-cell array comprising a plurality of memory cells laid out therein as memory cells each capable of storing data;

a read circuit used in a data read operation to read out data from said memory-cell array;

a write circuit used in a data write operation to write data into said memory-cell array;

a read clock generation circuit for generating a read clock signal to be supplied to said read circuit in said data read operation to read out data from said memory-cell array;

a write clock generation circuit for generating a write clock signal to be supplied to said write circuit in said data write operation to write data into said memory-cell array;

a read pulse-width adjustment circuit provided in said read clock generation circuit as a circuit for adjusting the pulse width of said read clock signal generated by said read clock generation circuit; and a write pulse-width adjustment circuit provided in said write clock generation circuit as a circuit for adjusting the pulse width of said write clock signal generated by said write clock generation circuit; wherein:

said pulse width of said read clock signal and said pulse width of said write clock signal are adjusted individually;

said read pulse-width adjustment circuit provided in said read clock generation circuit has a delay circuit for delaying an input signal and a logic gate for forming a waveform on the basis of a signal output by said delay circuit; and a plurality of said logic gates is provided at locations spread in said write circuit.

11. A semiconductor memory device according to claim 10 wherein:

said write circuit includes:

an address buffer for storing an address signal;

a row-system decode circuit for generating a selection signal, which is used for selecting a row system, on the basis of said address signal stored in said address buffer; and a column-system decode circuit for generating a selection signal, which is used for selecting a column system, on the basis of said address signal stored in said address buffer;

one of said logic gates is provided for said row-system decode circuit included in said write circuit; and another one of said logic gates is provided for said column-system decode circuit included in said write circuit.

12. A semiconductor memory device according to claim 11 wherein:

said logic gate provided for said row-system decode circuit outputs a signal representing computed logic of a signal generated by said row-system decode circuit and a signal generated by said delay circuit; and said logic gate provided for said column-system decode circuit outputs a signal representing computed logic of a signal generated by said column-system decode circuit and a signal generated by said delay circuit.

13. A semiconductor memory device according to claim 10 wherein:

said read pulse-width adjustment circuit and said write pulse-width adjustment circuit each have a delay circuit and a delay adjustment circuit for adjusting a signal delay of said delay circuit; and said delay adjustment circuit includes a fuse circuit for determining a state of a control signal for adjusting said signal delay of said delay circuit.

14. A semiconductor memory device according to claim 10 wherein:

said read pulse-width adjustment circuit and said write pulse-width adjustment circuit each have a delay circuit and a delay adjustment circuit for adjusting a signal delay of said delay circuit; and said delay adjustment circuit includes a flip-flop circuit for determining a state of a control signal for adjusting said signal delay of said delay circuit.

* * * * *